United States Patent [19]

Nagata et al.

[11] Patent Number: 5,091,743
[45] Date of Patent: Feb. 25, 1992

[54] IMAGE RECORDING APPARATUS CONTROLLABLE TO ONE OF EXPOSURE CONDITION AND PRESSURE DEVELOPING CONDITION

[75] Inventors: Osamu Nagata, Aichi; Yoshinori Endo, Toyota; Keiji Seo, Nagoya, all of Japan

[73] Assignee: Brother Kogyo Kabushiki Kaisha, Aichi, Japan

[21] Appl. No.: 673,345

[22] Filed: Mar. 22, 1991

[30] Foreign Application Priority Data

| Mar. 30, 1990 | [JP] | Japan | 2-85233 |
| Mar. 30, 1990 | [JP] | Japan | 2-85234 |
| Mar. 30, 1990 | [JP] | Japan | 2-85235 |
| Mar. 30, 1990 | [JP] | Japan | 2-85236 |
| Apr. 4, 1990 | [JP] | Japan | 2-89573 |
| Apr. 26, 1990 | [JP] | Japan | 2-110816 |

[51] Int. Cl.$^5$ .............................. G03B 27/52
[52] U.S. Cl. ............................. 355/30; 355/27
[58] Field of Search ............ 355/27, 30; 430/138; 354/301–303

[56] References Cited

U.S. PATENT DOCUMENTS

| 4,943,827 | 7/1990 | Good et al. | 355/30 |
| 4,945,383 | 7/1990 | Kobayashi et al. | 355/30 |
| 5,028,954 | 7/1991 | Yamamoto et al. | 355/30 |
| 5,041,865 | 8/1991 | Asano et al. | 355/30 |

Primary Examiner—Richard A. Wintercorn
Attorney, Agent, or Firm—Oliff & Berridge

[57] ABSTRACT

An image recording apparatus having an exposure unit, a pressure developing unit and a thermal fixing unit for forming an output color image on a developer medium which image corresponds to a latent image formed on a photosensitive pressure sensitive recording medium or microcapsule sheet. The apparatus is further provided with a sensor means for detecting one of humidity at or around the exposure unit, temperature at or around the exposure unit, temperature at or around a pressure developing unit, temperature at the thermal fixing unit, a pressure developing speed of the pressure developing unit, and pressure level of the pressure developing unit. In response to the detection, exposure condition or pressure developing condition is controllable.

45 Claims, 31 Drawing Sheets

IMAGE RECORDING APPARATUS CONTROLLABLE TO ONE OF EXPOSURE CONDITION AND PRESSURE DEVELOPING CONDITION

BSCKGROUND OF THE INVENTION

The present invention relstes to an image recording apparatus which employs a photosensitive image recording medium. More particularly, the invention relates to such image recording apparatus capable of controlling at least one of exposure condition and pressure developing condition in accordance with changes in ambient humidity, temperature at or around an exposure unit, temperature at a around a pressure developing unit, pressure developing speed, pressure applied to the recording medium at the pressure developing unit, and a temperature in a thermal fixing unit.

A photosensitive pressure sensitive image recording medium has been known as described in U.S. Pat. No. 4,399,209. The photosensitive recording medium includes a base substrate and an immense numbers of microcapsules coated on the substrate. Each of the microcapsules encapsulate therein chromogenic materials reactable with a developer material to generate a color and photo-curable resins photocurable upon exposure to light. One of the microcapsules encapsulate therein a chromogenic material of cyan and a photo-curable resin photo-curable upon exposure to red light. Another microcapsules encapsulate therein a chromogenic material of magenta and a photo-curable resin photo-curable upon exposure to green light. And remaining microcapsules encapsulate therein a chromogenic material of yellow and a photo-curable resin photo-curable upon exposure to blue light.

The above described photosensitive pressure sensitive image recording medium is installed in a light shieldable sheet cartridge which is assembled in the image recording apparatus. The photosensitive pressure sensitive recording medium or the microcapsule sheet is drawn from the sheet cartridge, and is subjected to exposure to image carrying light through a lens unit, to thereby provide a latent image on the photosensitive sheet. That is, the light exposed microcapsules are photo-cured, whereas unexposed microcapsules are not photo-cured. The microcapsule sheet is then superposed with a developer medium coated with the developer materials, and are pressed together. Therefore, the nonphotocured microcapsules are ruptured so as allow the chromogenic material to flow out of the microcapsules, and the chromogenic material is reacted with the developer material to generate a color. Therefore, an output image corresponding to an image of the original is provided on the developer medium. Then the developer medium carrying the output image is fed to a thermal fixing unit where the output image is thermally fixed to the developer medium substrate and at the same time gloss is imparted to the image.

In a conventional image recording apparatus which employs the above described photosensitive pressure sensitive recording medium or the microcapsule sheet, color filter unit is disposed so as to position a selected color filter across an optical path extending between a light source and an exposure stand on which the microcapsule sheet is positioned for its exposure. By disposing the filter, color balance of the output image is controllable.

Further, as described in Japanese Patent Application Kokai No. 62-204277, light uncorrelated with the original image (containing no imaging information) is also applied to the photosensitive recording medium immediately before or after the exposure operation. The additional light may be a white color light. By this additional exposure, gamma characteristic of the photosensitive pressure sensitive recording medium is improved so as to obtain the output image having high color gradation.

The image recording operation undergoes various restriction in view of various factors. For example, photosensitivities of the color forming materials may be changed due to ambient temperature change, and photo-curing sensitivities of the photo-curable resins may be changed due to ambient temperature change. If humidity and temperature are changed, color density of each color and mutual color balance may be changed to degrade or change quality of the output image.

SUMMARY OF THE INVENTION

In view of the above-described standpoint, the present invention has been made to provide an improved image recording apparatus in which stabilized output image can be obtained regardless of change in one of humidity, temperature at or around an exposure unit, temperature at or around a pressure developing unit, pressure developing speed, applied pressure to the recording medium at the pressure developing unit, and a temperature of a thermal fixing unit by primarily controlling exposure condition.

These and other objects of the invention will be attained in the present invention by providing An image recording apparatus for forming a latent image corresponding to an image of an original on a photosensitive image recording medium and recording an output color image on a basis of the latent image on a developer medium; the photosensitive image recording medium being coated with different kinds of color forming materials, the apparatus comprising: a frame. An exposure unit for an exposure operation comprising a light source, a filter unit having a plurality of filters of different colors, and an exposure stand for forming the latent image on the photosensitive image recording medium positioned on the exposure stand, an optical path being provided between the light source and the exposure stand through the filter unit, and each of the filters being movable into and out of the optical path, a pressure developing unit for applying pressure to the photosensitive recording medium carrying the latent image and the developer medium superposed therewith in order to provide the output image on the developer medium, a thermal fixing unit positioned downstream of the pressure developing unit for thermally fixing the output image on the developer medium, and a sensor means for detecting one of humidity with the frame, temperature at or around the exposure unit, temperature at or around the pressure developing unit, temperature at the thermal fixing unit, a pressure developing speed of the pressure developing unit, and pressure level of the pressure developing unit, control means connected to the filters for controlling position of the filters of the filter unit relative to the optical path in response to a detection by the sensor means.

In another aspect of the invention, there is provided An image recording apparatus for forming a color latent image corresponding to an image of an original on a photosensitive image recording medium and recording an output color image on a basis of the latent image on a developer medium, the photosensitive image recording medium being coated with different kinds of color forming materials, the apparatus comprising a frame, an exposure unit comprising a first exposure unit and an auxiliary exposure unit, the first exposure unit including a first light source, a first filter unit having a first set of plurality of filters of different colors for forming the color latent image on the photosensitive image recording medium, and the auxiliary exposure unit being positioned adjacent the exposure stand and including an auxiliary light source, an auxiliary filter unit having an auxiliary set of plurality of filters of different colors for controlling a color gradation, an optical path being provided between the light source and the exposure stand through the first and auxiliary filter units, and each of the filters being movable into and out of the optical path, a pressure developing unit positioned downstream of the exposure unit for applying pressure to the photosensitive recording medium carrying the latent image and the developer medium superposed therewith in order to provide the output image on the developer medium, a thermal fixing unit positioned downstream of the pressure developing unit for thermally fixing the output image on the developer medium, a sensor means for detecting one of humidity within the frame, temperature at or around the exposure stand, temperature at or around the pressure developing unit, temperature at the thermal fixing unit, a pressure developing speed of the pressure developing unit, and pressure level of the pressure developing unit; control means connected to the sensor means and to the first set of filters, auxiliary set of filters, the first light source and the auxiliary light source for controlling at least one of a position of the first set of filters relative to the optical path, a position of the auxiliary set of filters relative to the optical path, irradiation amount of the first light source, and irradiation amount of the auxiliary light source in response to a detection from the sensor means the control means, the control means comprising a CPU and a memory means connected to the CPU, the memory means storing therein at least one of a first data of the first set of filters position, a second data of irradiation amount of the first light source, a third data of the auxiliary light source position, and a fourth data of irradiation amount of the auxiliary light source, these data being provided at every stages of one of the humidity, the temperature, the pressure developing speed and the pressure level.

In still another aspect of the invention, there is provided an image recording apparatus for forming a color latent image corresponding to an image of an original on a photosensitive image recording medium and recording an output color image on a basis of the latent image on a developer medium, the apparatus comprising a pressure developing unit for applying pressure to the photosensitive recording medium carrying the latent image and the developer medium superposed therewith in order to provide the output image on the developer medium, the pressure developing unit providing a controllable pressure to the photosensitive recording medium and the developer medium, a temperature sensor for detecting a temperature at or around the pressure developing unit, and control means connected to the temperature sensor and the pressure developing unit for controlling the pressure of the pressure developing medium in response to the temperature detected by the temperature sensor.

In still another aspect of this invention, there is provided an image recording apparatus for forming a color latent image corresponding to an image of an original on a photosensitive image recording medium and recording an output color image on a basis of the latent image on a developer medium, the apparatus comprising a pressure developing unit for applying pressure to the photosensitive recording medium carrying the latent image and the developer medium superposed therewith in order to provide the output image on the developer medium, the pressure developing unit providing a controllable pressure developing speed, a temperature sensor for detecting a temperature at or around the pressure developing unit, and control means connected to the temperature sensor and the pressure developing unit for controlling the pressure developing speed of the pressure developing medium in response to the temperature detected by the temperature sensor.

DETAILED DESCRIPTION OF THE PREFERRED EMBODIMENT

(1) Basic Construction of an Image Recording Apparatus

A basic construction of an image recording apparatus to which the present invention is applied will be described with reference to FIGS. 1 through 5.

Figure 1:
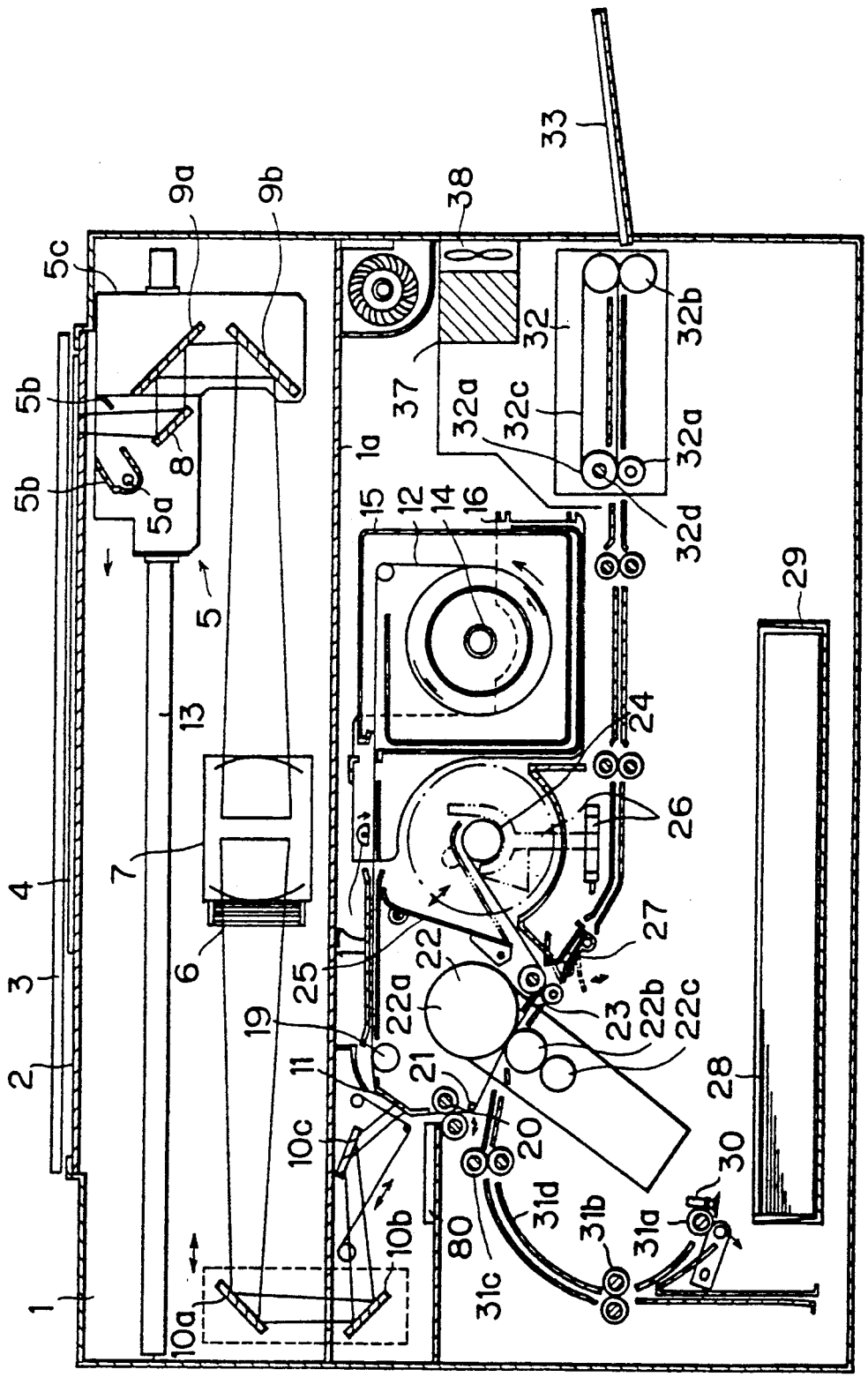
FIG. 1 is a schematic cross-sectional view showing a basis construction of an image recording apparatus to which the present invention embodied.

FIG. 1 shows an overall structure of the image recording apparatus 1 which generally employs an elongated photosensitive pressure sensitive image recording sheet or a microcapsule sheet 12 and a cut developer sheet or an output image recording sheet 28. The microcapsule sheet 12 has a substrate whose surface is coated with microcapsules encapsulating therein chromogenic materials reactable with a developer material coated over a substrate of the developer sheet 28. By this reaction, an output color image is provided on the developer sheet 28. Details of these image recording mediums are disclosed in a U.S. Pat. No. 4,399,209, and therefore, further description can be neglected.

At a top portion of the image recording apparatus 1, a transparent original support glass 2 for mounting thereon an original 4 is provided, and a support glass cover 3 is pivotally disposed over the original support glass 2. Between the support glass 2 and the cover 3, the original 4 is positioned with its imaging surface facing downwardly.

An optical system is provided below the original support glass 2. The optical system includes a light source 5 including a halogen lamp 5a, reflectors 5b, and a reflection mirror 8, and a frame member 5c is provided for housing therein the light source 5. The frame member 5c is formed with a slit (not shown) for allowing light to pass therethrough toward the original support glass 2. A shaft 13 extends in parallel with the original support glass 2, and the frame member 5c is reciprocally movable along the shaft 13. The light source 5 provides a line light toward the original support glass 2 in a direction perpendicular to the moving direction of the frame member 5c. The light passing through the original support glass 2 is reflected at the original 4 and is directed downwardly.

The optical system also includes a first pair of reflection mirrors 9a, 9b supported by the frame member 5c but movable independent of the light source 5, another pair of reflection mirrors 10a, 10b, a projection lens 7, a filter unit 6 and a final reflection mirror 10c. The lens 7 and the filter unit 6 are positioned between the first and second pairs of the reflection mirrors 9a, 9b and 10a, 10b. The filter unit 6 is adapted for controlling color tone of an output image. The light reflected from the original 4 is reflected at the reflection mirror 8 and the first pair of reflection mirrors 9a, 9b, so that the light is directed toward the second pair of the reflection mirrors 10a, 10b through the lens 7 and the filter 6 in a direction in parallel with the moving direction of the light source 5. Details of the filter unit 6 will be described later with reference to FIG. 2.

An exposure stand 11 is provided at a position adjacent the second pair of the reflection mirrors 10a, 10b for exposing the microcapsule sheet 12 to image carrying light. For this, the final reflection mirror 10c is provided between the reflection mirror 10b and the exposure stand 11 for directing the light reflected from the second pair of the reflection mirrors 10a, 10b toward the exposure stand 11. Accordingly, a latent image corresponding to the image of the original 4 is formed on the microcapsule sheet 12 positioned on the exposure stand 11.

At a position below the exposure stand 11, there is provided an auxiliary exposure unit 80 for exposing the microcapsule sheet 12 to another light after the sheet 12 is subjected to the above described exposure operation. The reason for the auxiliary exposure operation will be described later in conjunction with various embodiments of the present invention, and detailed arrangement of the auxiliary exposure unit 80 will be described later with reference to FIGS. 3 and 4.

The second pair of the reflection mirrors 10a, 10b are normally stationarily positioned. However, these mirrors are movable together in the axial direction of the shaft 13 so as to control an optical path length in accordance with the change in copying magnification (m) such as size enlargement or reduction. Further, provided that a feeding velocity of the microcapsule sheet 12 is represented by "V", and the copying magnification is represented by "m", the moving speed of the halogen lamp 5a and the mirror 8 is set to V/m, and the moving speed of the first pair of reflection mirrors 9a and 9b is set to V/2 m in order to obtain the latent image on the microcapsule sheet 12 positioned on the exposure stand 11 with the desired magnification m.

The elongated microcapsule sheet 12 is of a rolled form and a leading end portion of the sheet 12 is of a rolled with a leader tape portion (not shown). More specifically, at a center portion of the copying apparatus 1, a magazine 16 is disposed, and a sheet cartridge 15 is detachably positioned in the magazine 16. In the sheet cartridge 15, a rolled microcapsule sheet 12 is wound over a cartridge sheet 14. Within the magazine 16, a sector roller 17 is provided for introducing the leader tape portion of the microcapsule sheet 12 into a predetermined position of the sheet path so as to direct the leader portion toward the exposure stand 11.

Further, feed rollers 19 is rotatably provided at a position downstream of the sector roller 17 and below the exposure stand 11, and another feed rollers 20, 20 are rotatably provided at a position downstream of the feed roller 19. One of the feed rollers 20 is movable toward and away from the remaining feed roller 20. Between the feed rollers 19 and 20, the exposure stand 11 is provided. Moreover, a dancer roller or a tension control roller 21 is provided for controlling a sheet slack of the microcapsule sheet, and a separation roller 23 is rotatably provided for separating the microcapule sheet 12 from the developer sheet 28.

A pressure developing unit 22 having a large diameter pressure roller 22a, a small diameter pressure roller 22b and a back-up roller 22c is positioned between the dancer roller 21 and the separation roller 23 for pressure developing operation. Detailed arrangment of the pressure developing unit 22 is described below with reference to FIG. 5. A takeup shaft 24 is provided for taking up the light exposed microcapsule sheet 12. Thus, the microcapsule sheet path is defined by, in order, the feed sector roller 17, the feed roller 19, an upper surface of the exposure stand 11, the feed rollers 20, the dancer roller 21, the pressure developing unit 22, the separation roller 23 and the takeup shaft 24. Incidentally, a partitioning wall 1a is provided so as to prevent the microcapsule sheet 12 positioned at upstream of the exposure stand 11 from being irradiated with light.

The feeding velocity of the microcapsule sheet 12 is controlled at constant speed, and the feeding movement is in synchronism with the movements of the mirrors 8, 9a and 9b. Accordingly, a latent image in line-by-line basis is successively provided on the microcapsule sheet 12 when it passes through the exposure stand 11.

An automatic sheet loading function is given in the image recording apparatus. By the automatic loading function, the leader tape portion of the rolled microcapsule sheet 12 can be automatically directed along the sheet path and is wound over the takeup shaft 24. Therefore, the subsequent microcapsule sheet 12 can be automatically installed at the sheet path. For this automatic loading, the above described sector roller 17 provided in the magazine 16 will initiate the pulling out operation of the leader portion of the microcapsule sheet 12. Further, a separation chute 27 is pivotably provided at a position downstream of the separation roller 23 so as to direct the leader portion toward the takeup shaft 24. Furthermore, an upper guide 25 and a lower guide 26 are provided immediately above and below the takeup shaft 24, respectively for guiding the winding of the leader portion over the takeup shaft 24.

The lower guide 26 is pivotally provided and movable between a solid line position and a dotted line position. Further, the upper guide 25 and the separation chute 27 are also pivotally movable in the directions indicated by respective arrows. For loading the microcapsule sheet at the sheet path, the upper guide 25, the lower guide 26 and the separation chute 27 are moved to positions indicated by a dotted chain lines in FIG. 1 for permitting the leader tape to be wound over the takeup shaft 24. On the other hand, when the loading operation is completed, these are moved to positions indicated by solid lines in FIG. 1, so that image recording operation is achievable.

At a position below the pressure developing unit 22, a sheet cassette 29 is installed in which a stack of the cut developer sheets 28 are stored. At a position above the cassette 29, a sheet feed mechanism 30 is provided which includes a suction means so as to deliver each one of the developer sheets 28 toward the pressure developing unit 22. Between the sheet feed mechanism 30 and the pressure developing unit 22, sheet feed rollers 31a, 31b, 31c and a sheet feed guide 31d are provided. The developer sheet 28 is thus delivered to an upstream side of of the pressure developing unit 22.

Further, a thermal fixing unit 32 is provided at a position downstream of the separation chute 27. The thermal fixing unit 32 includes a heat roller 32a for heating the developed sheet 28, a discharge roller 32b and a transferring belt 32c mounted between the heat roller 32a and the discharge roller 32b. In the heat roller 32a, a heater 32d is provided for heating the heat roller 32a. A discharge tray 33 is provided at a position downstream of the thermal fixing unit for receiving the developer sheet 28 in which a visible output image is formed. Further, at a position above the thermal fixing unit 32, provided are a deodorization filter 37 for absorbing gaseous component released from the developer sheet 28 and generated at the thermal fixing operation and a fan 38 for directing gaseous odor toward the filter 37.

With this structure, if the sheet cartridge 15 is mounted on the magazine 16, the automatic sheet loading operation will be initiated. The feed sector roller 17 is rotated about its axis by at least once so as to pull out the leader tape portion from the cartridge 15 to the feed rollers 20, 20. Then, the rotation of the feed roller 17 is stopped whereas the feed rollers 20, 20 are driven to further feed the leader tape portion toward the pressure developing unit 22. In this case, the separation chute 27, the upper guide 25 and the lower guide 26 are moved to positions indicated by one dotted chain lines in FIG. 1, so that the leader tape portion can be directed to the takeup shaft 24 and is wound thereover. Upon completion of the automatic sheet loading, the upper guide 25, the lower guide 26 and the separation chute 27 are moved to their solid line positions shown in FIG. 1 for performing the image recording operation.

If a copy start key (not shown) is manipulated, the reflection mirror 8 and the halogen lamp 5a are moved at a speed V/m, and the first pair of reflection mirrors 9a, 9b are moved at a speed V/2 m assuming that the microcapsule sheet 12 is fed at a speed of V with aiming at image magnification of m. Since the feeding speed of the microcapsule sheet 12 is synchronized with the moving speeds of the mirrors 8, 9a, 9b, a line latent image is successively formed on the microcapsule sheet 12 when it passes over the exposure stand 11. This moving speed ratio is provisionally set in accordance with the selected magnification m.

The microcapsule sheet 12 which carries the latent image is further transferred toward the pressure developing unit 22, and at the same time, the developer sheet 28 is fed thereto by the sheet feed mechanism 30 and the feed rollers 31a, 31b, 31c. The latent image surface of the microcapsule sheet 12 is superposed with the developer material surface of the developer sheet 28 at the pressure developing unit 22, and these are pressed together. Therefore, unexposed microcapsules are ruptured to provide a chromogenic reaction with the developer materials of the developer sheet 28, to thereby form a visible color image on the developer sheet 28.

The microcapsule sheet 12 passed through the pressure developing unit 22 is separated from the developer sheet 28 by the separation roller 23 and is fed toward the takeup shaft 24. On the other hand, the developer sheet 28 is fed to the thermal fixing unit 32 where the coloring of the visible image is promoted by the heat roller 32a. The thus treated developer sheet 28 is discharged out of the thermal fixing unit by the discharge roller 32b and is fed onto the discharge tray 33.

(2) Details of the Filter Unit 6

Figure 2:
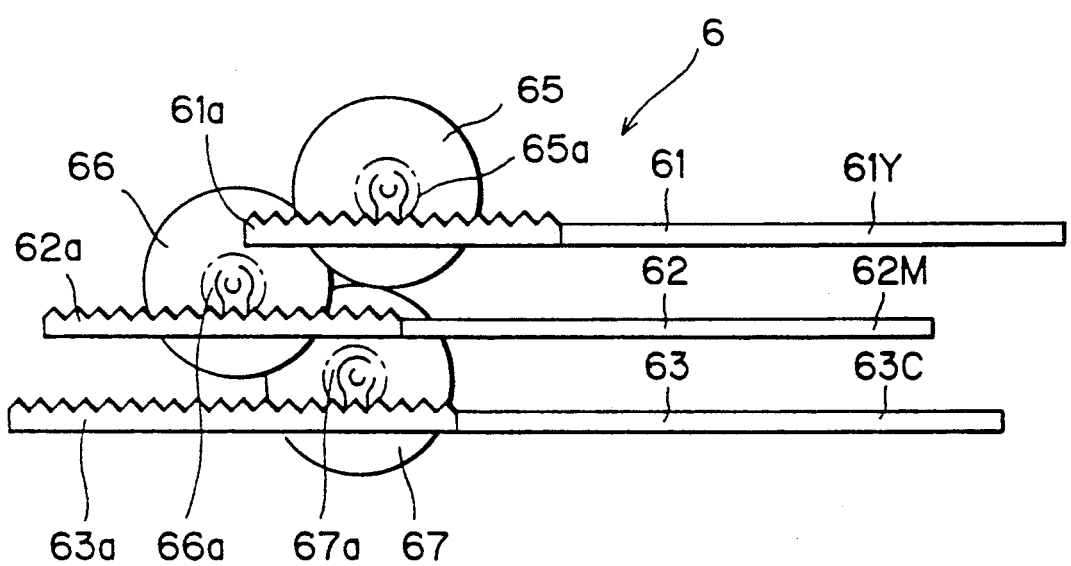
FIG. 2 is a schematic illustration showing a filter unit used in the image recording apparatus according to the present invention.

As shown in FIG. 2, the filter unit 6 includes optical filters 61, 62 and 63 movable toward and away from the optical path is a direction perpendicular thereto. These filters are positioned one after another in a vertical direction by a predetermined distance therebetween. The upper filter 61 has a free end portion provided with a yellow filter 61Y and a base portion provided with a rack 61a. The intermediate filter 62 has a free end portion provided with a magenta filter 62M and a base portion provided with a rack 62a. The lower filter 63a and a free end portion provided with a cyan filter 63c and a base portion provided with a rack 63a. Further, stepper motors 65, 66 and 67 are provided and pinions 65a, 66a and 67a are fixed to the stepper motor shafts, respectively. The pinions 65a, 66a and 67a are engageable with the racks 61a, 62a, 63a, respectively, so that the yellow filter 61Y, the magenta filter 62M and the cyan filter 63c are selectively moved toward and away from the optical path. In other words, only one of the filters is brought to a position across the optical path, or two or three filters are both brought to the position across the optical path so as to control light color tone directed toward the exposure stand 11.

Each of the movable filters 61, 62 and 63 are reciprocally supported by a guide frame (not shown) and movable between a position where the filter completely open the optical path and a position where the filter is completely positioned across the optical path. Each of the stepper motors 65, 66 and 67 is connected to a filter control circuit 106 described later. Therefore, rotation of the stepper motors is controllable in response to a filter control signal sent from the filter control circuit 106, to thereby control movement of the respective filters 61, 62 and 63 relative to the optical path, to thus control tone of the light passing through the filter unit 6. It goes without saying that the filter moving direction is defined so as to uniformly irradiate exposure light onto the microcapsule sheet 12 with respect to transverse of widthwise direction thereof.

(3) Details of the Auxiliary Exposure Unit 80.

Figure 3:
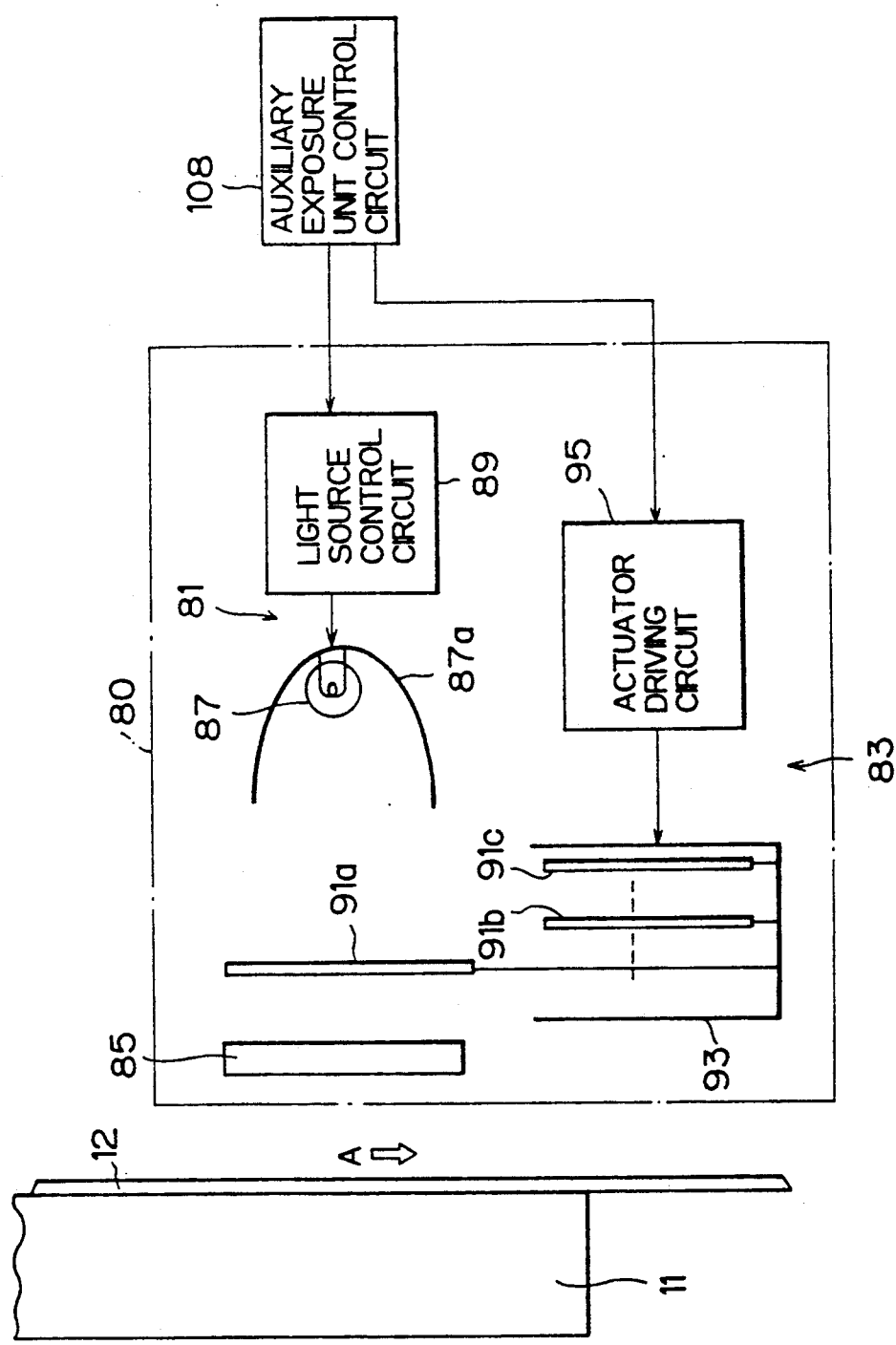
FIG. 3 is a schematic view showing an auxiliary exposure unit according to the present invention.

As described above, the auxiliary exposure unit 80 is provided downstream of the exposure stand 11 with repect to the sheet path as shown in FIG. 1. The auxiliary exposure unit 80 is positioned in confrontation with the photosensitive surface of the microcapsule sheet 12. In FIG. 3, the microcapsule sheet runs in a direction indicated by an arrow A. As shown in FIG. 3, the auxiliary exposure unit 80 includes a light emitting portion 81, an auxiliary filter portion 83 and a diffusion plate 85. The light emitting portion 81 includes an auxiliary light source such as an halogen lamp 87 provided with a reflector 87a, and a light source control circuit 89 for controlling ON/OFF turning and light irradiation amount of the light source 87.

The auxiliary filter portion 83 includes a plurality of auxiliary filters 91, an actuator 93 for moving at least one of the filters 91 to a position between the halogen lamp 87 and the diffusion plate 85, and actuator driving circuit 95 for driving the actuator 93. The arrangement of the filters 91 is the same as that of the filter unit 6.

Figure 4:
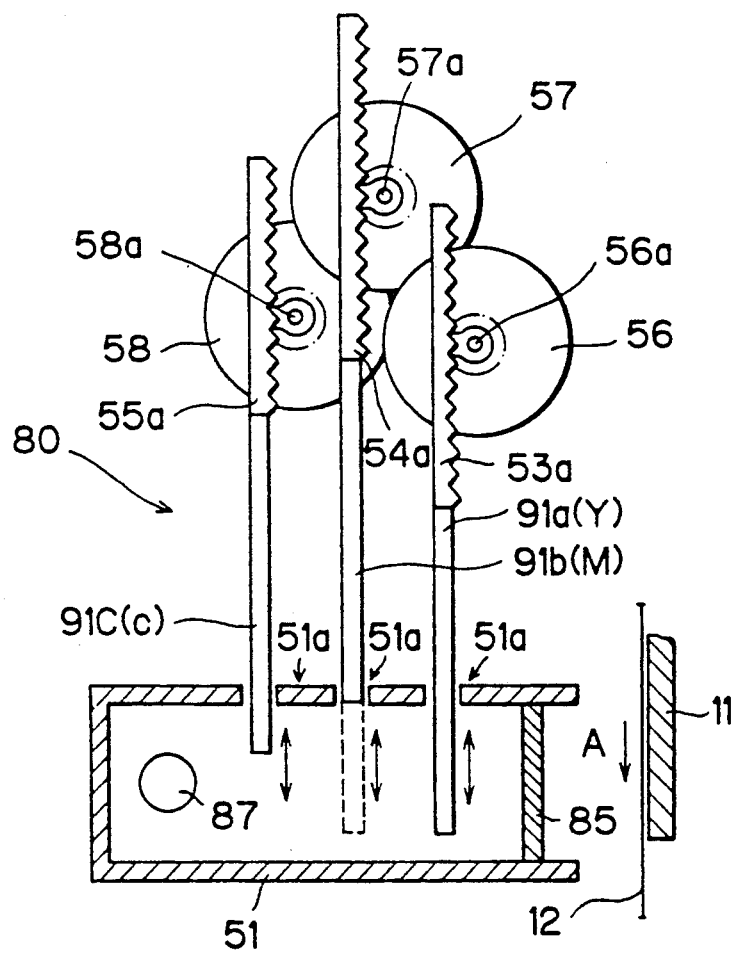
FIG. 4 is a schematic view particularly showing an auxiliary filter portions used in the auxiliary filter unit according to this invention.

As best shown in FIG. 4, the auxiliary exposure unit 80 is covered by a unit cover member 51, so that the light from the auxiliary exposure unit 80 is only applied to a limited area of the microcapsule sheet 12 which limited area is positioned in confrontation with the unit 50. The cover member 51 is formed with a plurality of slots 51a to allow the filters to pass therethrough. Within the cover member 51, the above described auxiliary halogen lamp 87 which irradiates as white light is disposed. The auxiliary halogen lamp 87 is of linear form and extends in a transverse direction of the microcapsule sheet 12. The length of the lamp 87 is slightly larger than the transversal length of the microcapsule sheet 12, and therefore, auxiliary exposure can be uniformly achieved over an entire transversal length of the sheet 12.

The auxiliary filters 91 includes a yellow filter 91a, a magenta filter 91b and a cyan filter 91c. Each of the filters 91a, 91b and 91c is provided with racks 53a, 53b, 53c each engageable with pinions 56a, 57a and 58a of corresponding stepper motors 56, 57 and 58. These racks, pinions and the stepper motors serve as the actuator 93 shown in FIG. 3. Upon selective rotation of the stepper motors 56, 57 and 58, at least one of the filters 91a, 91b and 91c is brought to a position between the auxiliary light source 87 and the diffusion plate 85 thorugh the slots 51a formed in the cover member 51. The moving direction of the auxiliary filters 91 is the same as the running direction A of the microcapsule sheet A.

The diffusion plate 85 diffuses colored light passing through the filter 91 so as to uniformly irradiate the light onto the microcapsule sheet 12. The light source control circuit 89 and the actuator driving circuit 95 are connected to an auxiliary exposure unit control circuit 108. Therefore, these circuits 89 and 95 are operated in response to an instruction signal from the auxiliary exposure unit control circuit 108.

Incidentally, the auxiliary light source control circuit 89 shown in FIG. 3 can be disposed with. However, relevant light amount control is achievable by controlling insertion amount of each of the auxiliary filters 91a, 91b and 91c. For example, if all auxiliary filters are inserted into the position between the auxiliary light source 87 and the diffusion plate 85, overall spectrum range of the light from the auxiliary light source 87 can be completely blocked. To achieve this, initial setting may be required. That is, all of the auxiliary filters are inserted by a half of full insertion. This state may be a reference position to define a reference light irradiation amount with respect to the microcapsule sheet 12. With the half insertion state, a suitable auxiliary light source 87 having a suitable light irradiation energy is selected.

(4) Details of the Pressure Developing Unit 22

Figure 5:
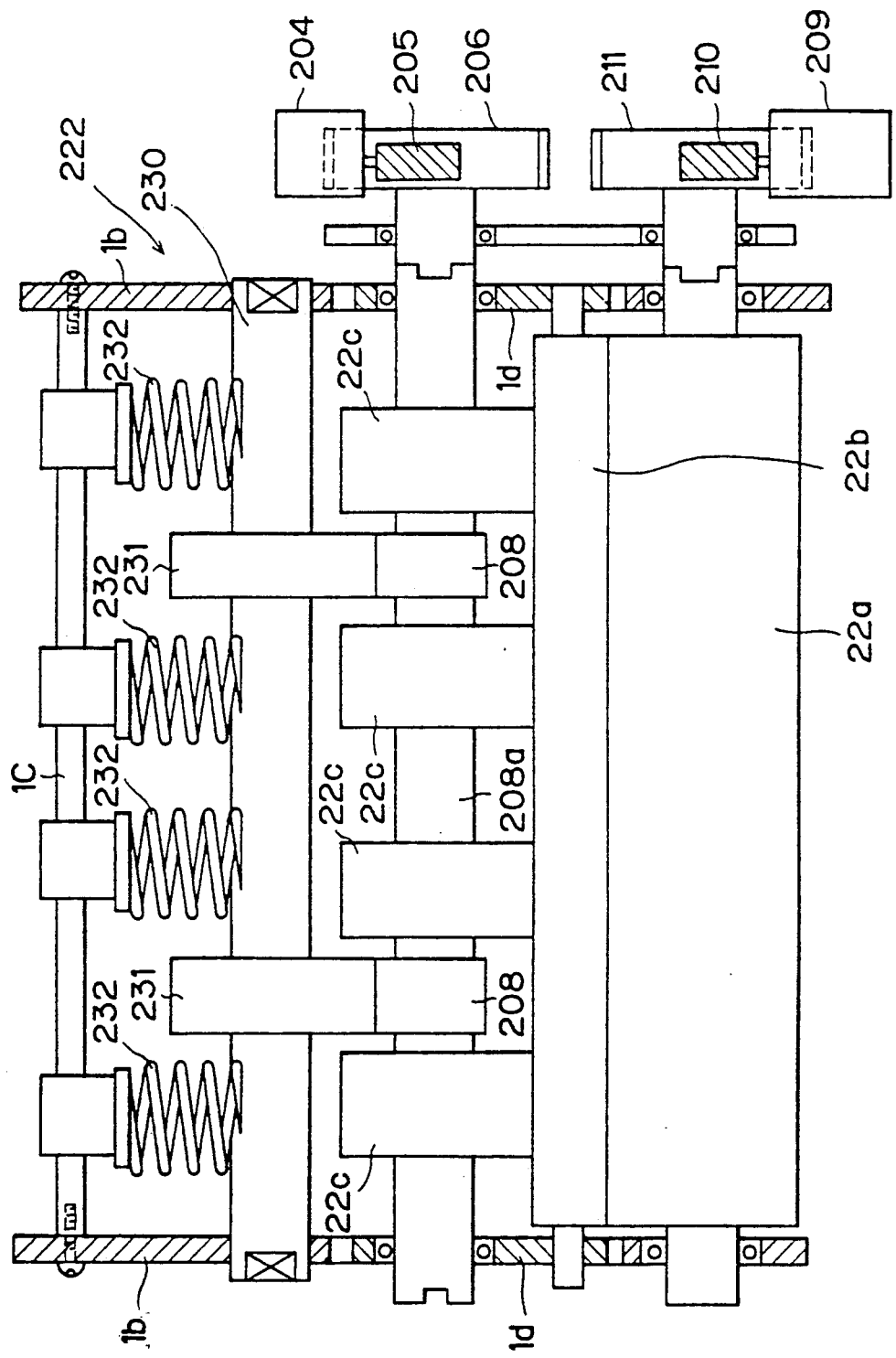
FIG. 5 is a schematic illustration showing a pressure developing unit used in the image recording apparatus according to this invention.

As described above, the pressure developing unit 22 generally includes the large diameter pressure roller 22a, the small diameter pressure roller 22b and a backup roller 22c. Detailed arrangement of the pressure developing unit 22 is shown in FIG. 5. The large diameter pressure roller 22a is rotatably supported by a pair of side plates 1b and 1b, and an upper plate 1c is disposed on the side plates 1b and 1b. The small diameter pressure roller 22b is rotatably supported by another pair of side plates 1d and 1d supported by the plates 1b and 1b and movable within a limited range with respect to the side plates 1b and 1b. The small diameter pressure roller 22b is disposed movable toward and away from the large diameter pressure roller 22a.

At a position outside the side plate 1b, there are provided a cam driving motor 204 and a roller driving motor 209. The large diameter pressure roller 22a has a rotation shaft whose one end is coupled to a gear wheel 211 engageable with a worm gear 210 coupled to the roller driving motor 209. Therefore, the large diameter pressure roller 22a can be rotated about its axis by the rotation of the roller driving motor 209 through the worm gear 210 and the gear wheel 211.

A cam shaft 208a is rotatably supported by the pair of another side plates 1d and 1d, and one end of the cam shaft 208 is coupled to a gear wheel 206. The cam driving motor 204 has a drive shaft fixedly provided with a worm gear 205 engageable with the gear wheel 206. Therefore, the rotation of the cam drive motor 204 is transmitted to the cam shaft 208 through the worm gear 205 and the gear wheel 206. The cam shaft 208a integrally provides two cam pieces 208, and rotatably provides four backup rollers 22c abuttable on the surface of the small diameter pressure roller 22b.

A pressure supporting shaft 230 is also rotatably journaled by the side plates 1b and 1b, and two urging rollers 231, 231 are rotatably supported by the pressure supporting shaft 230. Surfaces of the urging rollers 231, 231 are in contact with the respective cam pieces 208 and 208 as shown. Further, one ends of a plurality of pressure regulating springs 232 are supported by the upper plate 1c, and another ends of the pressure regulating springs 232 are seated on the pressure supporting shaft 230. Therefore, the biasing forces of the pressure regulating springs 232 are applied to the small diameter pressure roller 22b through the urging rollers 231, the cam pieces 208 and the backup rollers 22c. Therefore, the small diameter pressure roller 22b is normally urged toward the large diameter pressure roller 22a because of the biasing force of the pressure regulating springs 232.

With this arrangement, the small diameter pressure roller 22b is initially positioned spaced away from the large diameter pressure roller 22a because of a given angular positions of the cam pieces 208. Therefore, the microcapsule sheet 12 and the developer sheet 28 superposed with each other are inserted into a space defined between the rollers 22a and 22b. When a part of the developer sheet 28 is inserted therebetween, the cam driving motor 204 is rotated by a predetermined angular amount. Accordingly, the cam pieces 208 are rotated so as to urge the small diameter pressure roller 22b toward the large diameter pressure roller 22a. Thus, the microcapsule sheet 12 as well as the developer sheet 28 are applied with pressure.

Then, the roller driving motor 209 is rotated, so that both large and small diameter rollers 22a and 22b are rotated in order to perform the pressure developing operation. If the pressure developing operation is completed, the roller driving motor 209 is deenergized, and the cam driving motor 204 is again energized for further angularly rotating the cam pieces 208, to thereby move the small diameter roller 22b away from the large diameter roller 22a.

(5) Control Arrangement According to a First Embodiment

In a first embodiment, exposure condition is changed in response to a change in humidity. That is, the photosensitive pressure sensitive recording medium 12 of this kind may vary its photosensitivity and color gradation in accordance with the change in ambient humidity. In order to obtain output images having a given quality, exposure control is required for compensating the humidity change. Further, even if atmospheric humidity is not changed, internal humidity within the image recording apparatus may be changed due to heat generated at the various components assembled therein.

Figure 6:
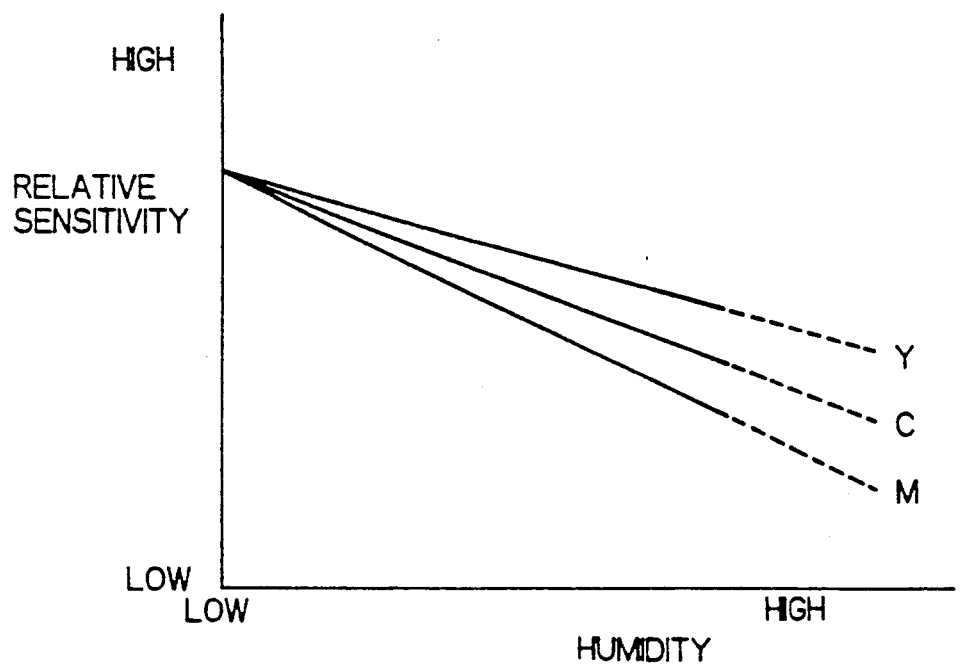
FIG. 6 is a graphical representation showing the relationship between humidity and relative sensitivities of each color of yellow, cyan and magenta.

More specifically, the relationship between the relative sensitivities of the microcapsule sheet 12 and the humidity is investigated. As is apparent from a graph shown in FIG. 6, sensitivities of the microcapsule sheet 12 is lowered with the increase in humidity. Further, the decrease rates in sensitivities with respect to each color of yellow, magenta and cyan are also different from one another. That is, magenta sensitivity is remarkably lowered with the increase in humidity, and yellow sensitivity is not so lowered with the humidity increase. The decreasing rate of the sensitivity of cyan is the intermediate level between the yellow and the magenta. Therefore, in case high humidity is provided, insertion amount of the magenta filter 62M of the filter unit 6 is decreased, whereas insertion amount of the yellow filter 61Y of the filter unit 6 is increased in order to obtain a proper color balance. If entire sensitivities are lowered, exposure amount of the light source 5a is increased to improve the entire sensitivity.

Figure 7:
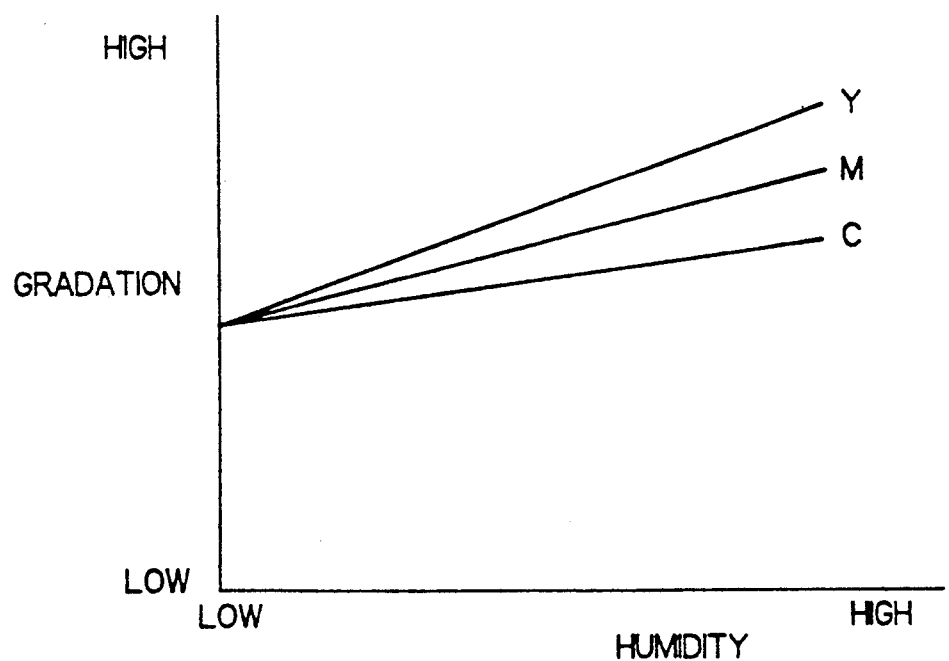
FIG. 7 is a graph showing the relationship between the humidity and gradation of each color of yellow cyan and magenta.

Further, the relationship between the color gradation and the humidity is investigated. As is apparent from a graph shown in FIG. 7, if high humidity is provided, high gradation results. Further, the gradation increase rate may vary dependent on each colors. For example, gradation improving rate of yellow becomes the highest, whereas gradation improving rate of cyan is the lowest with the increase in humidity. Therefore, insertion amount of the auxiliary yellow filter 91a is increased, and insertion amount of the auxiliary cyan filter 91c is decreased in the auxiliary filter portion 91 of the auxiliary exposure unit 80 in order to obtain constant gradation rate over each colors when high humidity is provided. Further, exposure amount of the auxiliary light source 87 is decreased in order to entirely lower the gradation characteristic.

Figure 8:
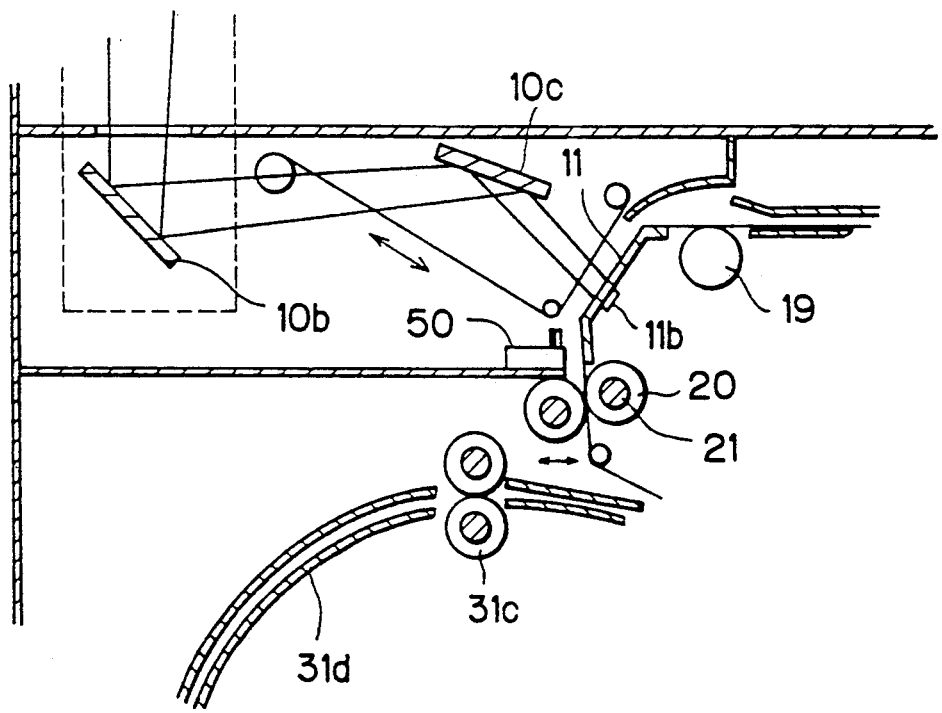
FIG. 8 is a partial schematic cross-sectional view particularly showing an exposure unit and a humidity sensor according to a first embodiment of this invention.

With the above in view, according to the first embodiment of this invention, a humidity sensor 11b is provided at a position above the auxiliary exposure unit 80 as shown in FIG. 8. Further, the humidity sensor 11b is connected to a control arrangement shown in FIG. 9 so as to control exposure in response to the humidity.

Figure 9:
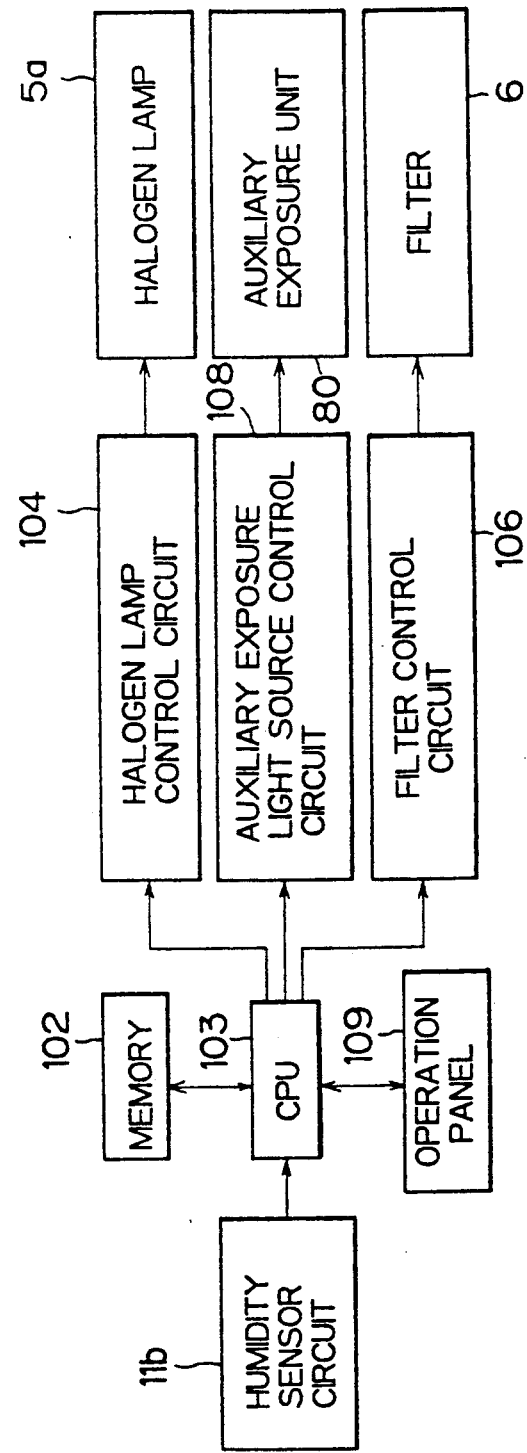
FIG. 9 is a block diagram showing a control arrangement for controlling filter insertion amounts and exposure amounts in response to humidity according to the first embodiment of this invention.
Figure 10:
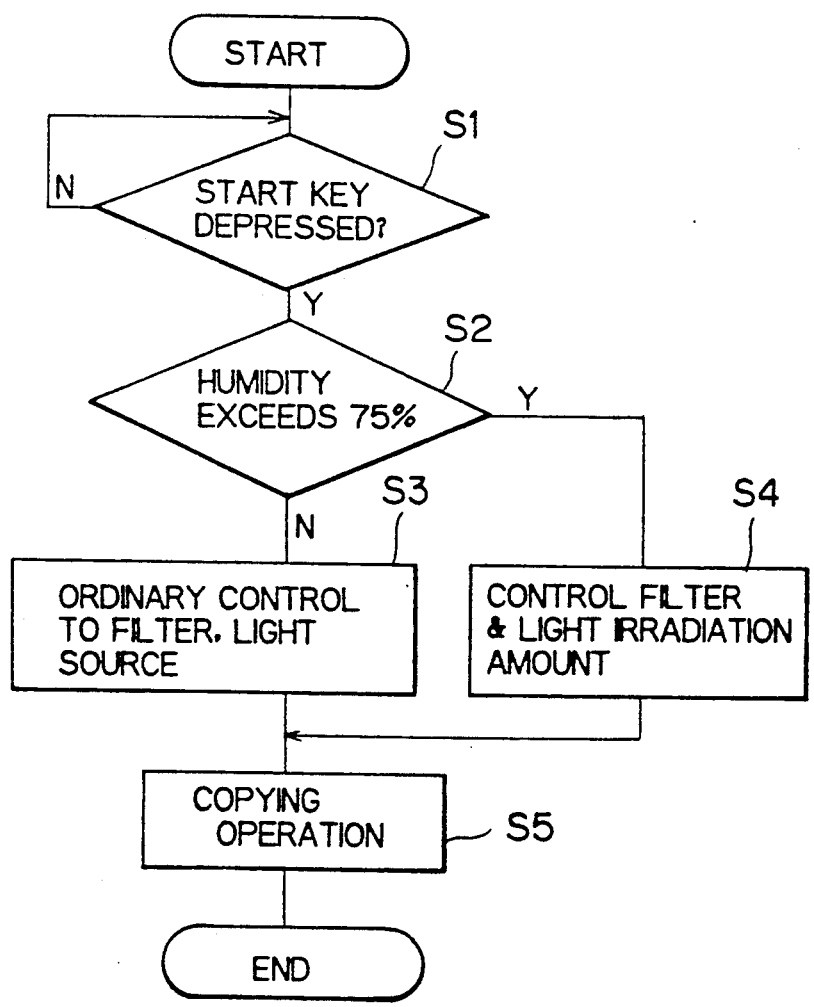
FIG. 10 is a flowchart for description of control routine executed by way of the control arrangement shown in FIG. 9.

According to the control arrangement shown in FIG. 9, there are provided a CPU 103 to which connected are key panel 109, provided with a copy start key and control keys for controlling filters and exposure amount by operator's manipulations, a look-up table memory 102 in which stored is insertion amounts of each of the filters and exposure amounts of the light sources 5a and 87 in response to the humidity, a halogen lamp control circuit 104, the auxiliary light source control circuit 108, and a filter control circuit 106. The halogen lamp control circuit 104 is connected to the halogen lamp 5a so as to control exposure amount of the halogen lamp 5a. Further, as described above, the auxiliary light source control circuit 108 is connected to the auxiliary exposure unit 80 (see FIG. 3), and the filter control circuit 106 is connected to the filter unit 6 so as to control insertion amount of each one of the filters 61, 62 and 63. With the arrangement, when the copy start key is manipulated, controls are made with respect to the light irradiation amount of the halogen lamp 5a, insertion amount of the filters 61, 62, 63 and the auxiliary exposure unit 80 in response to the signal from the humidity sensor circuit 11b as shown by a flowchart shown in FIG. 10.

According to the flowchart, in Step S1, judgment is made as to whether or not the copy start key is depressed. If the judgment falls Yes, the routine goes to Step S2 in which humidity around the exposure stand 11 is measured by the humidity sensor 11b, and the measured humidity level is transmitted to the CPU 103. In step S2, the determination is made as to whether or not the transmitted humidity exceeds 75%. If the humidity is not more than 75%, the routine proceeds into step S3 so as to perform an ordinary insertion motion of the filters as well as ordinary light irradiation from the light source 5a.

On the other hand, if the humidity exceeds 75%, the routine goes into Step S4 where filter insertion amount of the filter unit 6, exposure amount of the light source 5a and filter insertion amount of the auxiliary filters and the light irradiation amount of the auxiliary light source of the auxiliary exposure unit 80 are controlled. That is, in order to compensate the lowering of the sensitivities due to the humidity increase, the insertion amount of the magenta filter 62 is decreased whereas insertion amount of the yellow filter 61 is increased. Further, for the same purpose, light irradiation amount from the halogen lamp 5a is increased. At the same time, in the auxiliary exposure unit 80, insertion amount of the yellow filter 91a is increased whereas the insertion amount of the cyan filter 91c is decreased, and further, exposure amount from the halogen lamp 87 is decreased in order to lower the gradation. As described above, the control to the auxiliary exposure unit 80 is carried out by controlling the light source control circuit 89 and the actuator driving circuit 95 those shown in FIG. 3. Then, the routine goes into Step S5 where the above described copying operation (in connection with FIG. 1) is carried out, and then, the program is ended.

In the above described embodiment, various modifications may be conceivable. For example, optimum insertion amount of the filters and light irradiation amount of the light source are manually controlled by manipulating the control key of the control panel 109 in accordance with the detected humidity detected by the humidity sensor 11b.

Further, a warning lamp is provided on the key panel 109 so that the lamp is turned on if the humidity detected by the sensor 11b exceeds a predetermined level. Moreover, correction button is also provided on the key panel so as to correct the filter insertion amount and light irradiation amount to a preset levels. With the structure, if the humidity detected by the humidity sensor exceeds the predetermined level, the warning lamp on the key panel 109 is turned on, so that the operator can notify this fact. Then, the operator depresses the correction button so as to correct the position of the filters and irradiation amount of the light source to a proper level in accordance with the humidity increase.

Furthermore, insertion amount of the filters 61 through 63, exposure amount of the halogen lamp 5a, insertion amount of the auxiliary filters 91 and the exposure amount of the auxiliary light source 87 of the auxiliary exposure unit 80 are set stepwisely in accordance with every 5% increase of the humidity. These stepwise data are stored in the memory 102 in a table-like format. These data are derived from the memory 102 in accordance with the detected humidity level, and these filters and light sources are controlled so that optimum filter positions and light exposure amounts can be provided in accorance with the detected humidity.

Further, more, color tone control is also achievable by providing independent light sources with respect to each of the filters, and light irradiation amount of each of the light sources is controlled for controlling the color tone.

Thus, according to the first embodiment of this invention, output images having stabilized quality are obtainable irrespective of the humidity change.

(6) Control arrangement According to a Second Embodiment

A control arrangement according to a second embodiment of this invention will next be described with reference to FIGS. 11 through 15. In the control arrangement attention is drawn to a temperature change in the image recording apparatus which influences photosensitivities or color forming characteristics of color forming materials. More specifically, the photo-curing degree of the photo-curable resins of each color of cyan, magenta and yellow may be changed in accordance with the change in temperature. Therefore, output image quality may be changed due to the temperature change.

In an attempt to overcome this disadvantage, several efforts have been made so as to maintain the ambient temperature at a constant level. To this effect, plane-like heat generating means or cooling fan have been provided. Still however, such plane-like heat generator or the cooling fan are not effective, if external atmospheric temperature has high temperature. Therefore, such image recording apparatus is only available in the operation under narrow tolerable temperature. Further, even if the external temperature is sufficiently low, it takes several period so as to provide a proper allowable temperature by the operation of the plane-like heat generator and the cooling fan. Consequently, resultant image recording operation requires dead time.

With the above in view, in the second embodiment, attention is drawn to the gamma characteristic of the photosensitive pressure sensitive recording medium or the microcapsule sheet in relation to the exposure temperature. To be more specific, if the exposure temperature is relatively high in comparison with an ordinary exposure temperature, the magenta microcapsules and the cyan microcapsules become more photo-cured or hardened, so that the gamma characteristic to yellow is improved. By making use of this phenomena, the temperature control within the image recording apparatus can be eliminated, and image recording operation can be produced at low cost yet providing wide range operability regardless of the temperature change.

Figure 11:
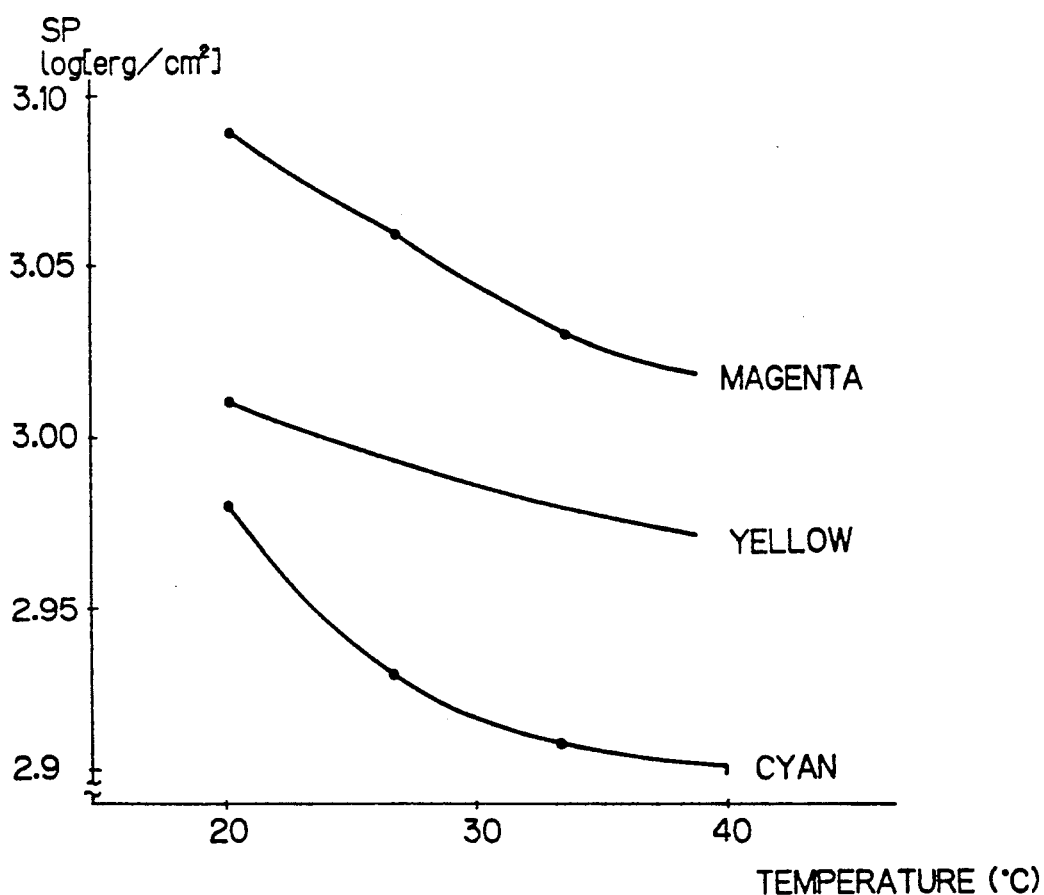
FIG. 11 is a graphical representation showing the relationship between the temperature and light energy required for obtaining a predetermined color density on a developer medium for demonstrating the relationship between the sensitivities and temperature with respect to each colors.

FIG. 11 shows the relationship between the temperature and photosensitivities of the microcapsules. The ordinate represents means values of common logarithm of each of the light energy amounts required for obtaining 10% and 90% density of each of yellow, magenta, and cyan colors on the developer medium. A reciprocal of the logcom implies sensitivity of each of the colors. The variation in the logcom of each of the colors with respect to temperature change from 20° to 40° C. is shown in the graph. Since the ordinate represents the logcom of the light energy, if the value is increased by "1", required energy becomes ten times as large as the previous level. In other words, sensitivity becomes high if the ordinate value is small.

As is apparent from the graph shown in FIG. 11, sensitivity of the microcapsule sheet becomes high if the temperature is elevated. Further, each color provide each sensitivity different from one another in accordance with the temperature change. By this difference, the developer sheet will become yellow in accordance with the temperature increase if the microcapsule sheet is uniformly exposed to white light.

Figure 12:
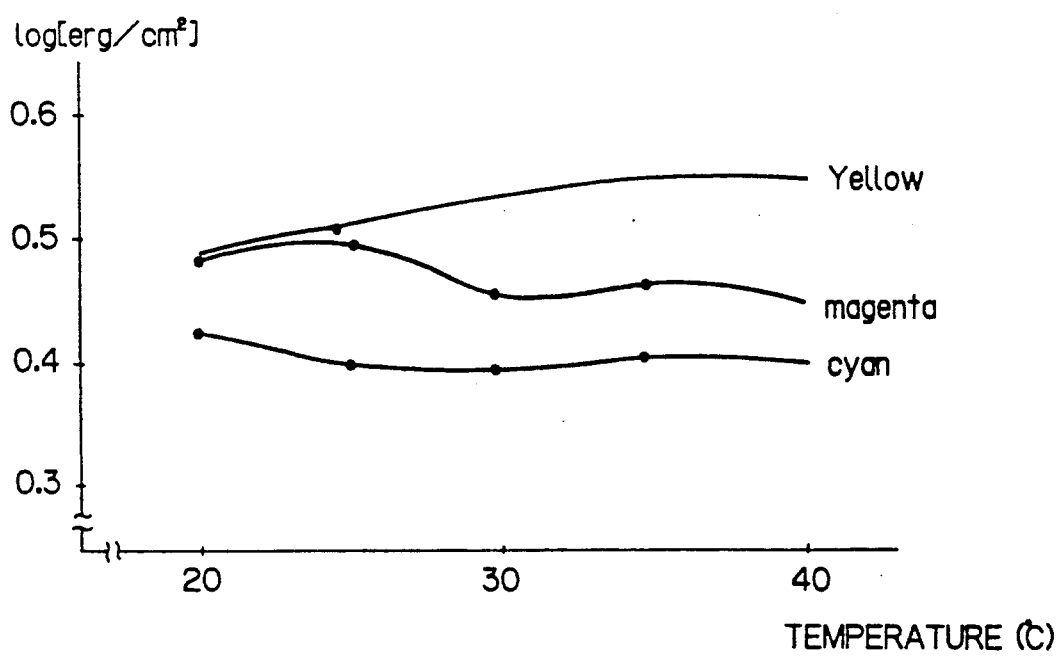
FIG. 12 is a graph showing the relationship between the temperature and light irradiation dynamic range for demonstrating the relationship between the color gradation and temperature with respect to each colors.

Further, FIG. 12 shows gradation characteristic of the microcapsule sheet. The ordinate of this graph represents difference in common logarithm of each of the light energy amounts required for obtaining 10% density and 90% density. The differential logcom value is plotted on the graph in relation to the temperature change. This value corresponds to dynamic range of light irradiation amount relative to each of the colors. Since the coloring dynamic range is constant, low gamma is provided if large light irradiation dynamic range is provided, to thereby provide high gradation characteristic.

As is apparent from the graph shown in FIG. 12, regarding cyan and magenta, the light irradiation amount dynamic range becomes narrow in accordance with the temperature elevation. On the other hand, regarding yellow, the dynamic range becomes wide in accordance with the temperature elevation.

Therefore, in order to effectively utilize the microcapsule sheet 12, the spectrum characteristic of the primary exposure light (which contains imaging information) should be deviated to yellow side in case of the temperature elevation. That is, insertion amounts of the magenta and cyan filters should be increased with respect to the filter unit 6. Further, since the entire sensitivities become high due to the temperature increase, entire irradiation light amount should be decreased. Moreover, since the light irradiation amount dynamic range becomes wide with respect to yellow (gamma value is lowered to enhance gradation) whereas the dynamic range with respect to other colors become narrow, (gradation becomes lowered), auxiliary exposure amount should be increased with respect to the colors of magenta and cyan and further, yellow color component of the auxiliary irradiation light should be decreased. That is, insertion amounts of the magenta and cyan filters should be decreased whereas insertion amount of the yellow filters should be increased with respect to the auxiliary filters.

Figure 13:
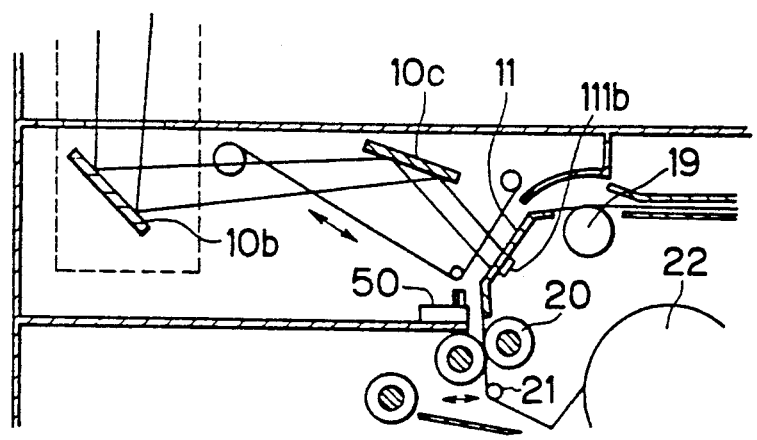
FIG. 13 is a partial schematic cross-sectional view particularly showing an exposure unit and a temperature sensor according to a second embodiment of this invention.
Figure 14:
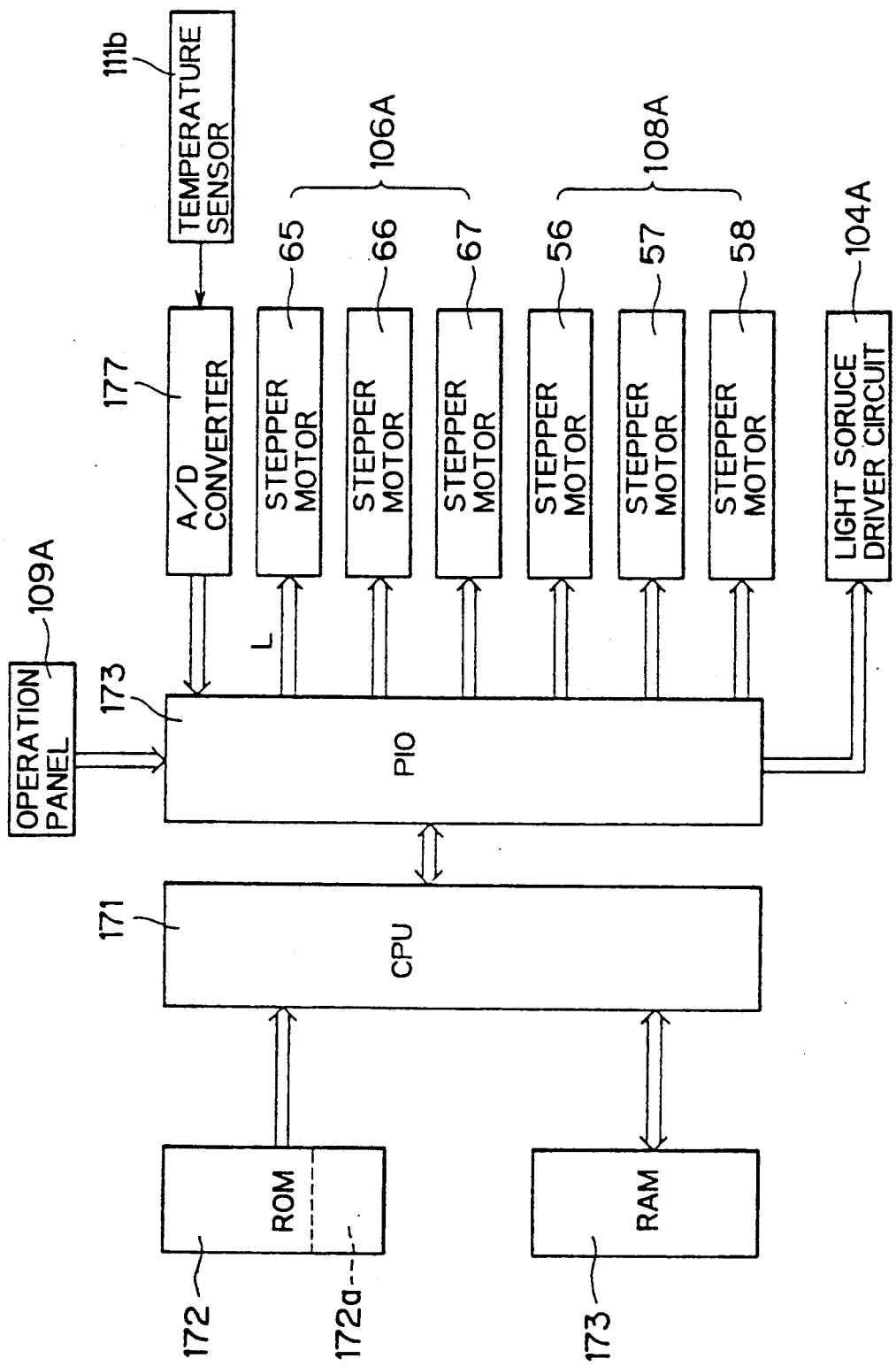
FIG. 14 is a block diagram showing a control arrangement for controlling filter insertion amounts and exposure amount in response to temperature according to the first embodiment of this invention.

With the above in mind, according to the second embodiment of this invention, as shown in FIG. 13, a temperature sensor 111b is positioned at a rear side of the exposure stand 11 so as to detect a temperature at or around the exposure unit, and the temperature sensor 111b is electrically connected to a control arrangement shown in FIG. 14.

The control arrangement shown in FIG. 14 includes a central processing unit (CPU) 171 to which connected is memory means such as a read only memory (ROM) 172 and a random access memory (RAM) 173. The ROM 172 stores therein a program for operating the CPU 171 and various parameters. The ROM 172 includes a look-up table portion 172a in which stored are exposure temperatures and optimum controlling conditions for the filter unit 6 and the auxiliary exposure unit 80 in association with the exposure temperature. Details of the look-up table 172a will be described later.

The CPU 171 is connected to a parallel input/output port (hereinafter simply referred to as "PIO) 173 to which the above described stepper motors 65 through 67 of the filter unit 6 and the stepper motors 56 through 58 of the auxiliary exposure unit 80 are connected. Thus, these motors are controlled by the CPU 171 through the PIO 173. The PIO 173 is also connected to an operation panel 109A for inputting data into the CPU 171. The operation panel 109A includes a power switch, a copy start switch, a color tone control switch, an auxiliary exposure switch, and a copying magnification setting switch. Further, a light source driving circuit 104A is also connected to the PIO 173 so as to control light irradiation amount of the light source 5a. Furthermore, an A/D converter 177 is provided having an output terminal connected to the PIO 173 and an input terminal connected to the temperature sensor 111b.

The look-up table 172a is started with an address A (offset value) in the ROM 172. The output value from the A/D converter 177 corresponds to a temperature T of the microcapsule sheet 12 at the exposure table 11. This value T is multiplied by seven times, and the offset value A is added to the multiplied value. An address is provided by the value. A memory cell of the ROM 172 in connection with the address stores therein an optimum yellow filter insertion amount L1 in case of the primary exposure operation at the temperature T. The insertion mount L1 is represented by the stepping numbers of the stepper motor 65 for moving the yellow filter to the optimum position from its reference position (retracted position away from the optical path). In the similar fashions, insertion amounts L2 and L3 of the magenta and cyan color filters 62 and 63 are stored in memory cells of second and third addresses, respectively. Furthermore, in another memory cells in conneccton with fourth to sixth addresses, stored are insertion amounts L4, L5 and L6 of the yellow, magenta and cyan filters 91a, 91b and 91c of the auxiliary filter units of the auxiliary exposure unit 80, and in still another memory cell in connection with seventh address, driving current I is stored for driving the halogen lamp 5a.

These data L1 through L6 and current I are experimentally obtained with respect to temperature change, and the following tendencies are provided in the control, that is;

(a) if T is large, L2 and L3 become large;
(b) if T is large, I becomes small;
(c) if T is large, L4 becomes large;
(d) if T is large, L5 and L6 become small;

Next, a control routine according to the second embodiment will be described with reference to FIG. 15. Description will be started after the automatic sheet loading operation is completed, that is, after the separation chute 27 restores its solid line position in FIG. 1.

After the completion of the automatic sheet loading, each of the filters of the filter unit 6 and the auxiliary exposure unit 80 are retracted away from the optical path. That is, each of the stepper motors 56, 57, 58, 65, 66 and 67 are energized for the filter retractions, and the filters are held at their standby positions of a predetermined period. This is the reference position of the filters in which all of the filters are retracted away from the optical path. In this state, each of the step motors is deenergized. The described operation (for obtaining the filter reference position) is carried out when the power switch is rendered ON. After this operation, a copying operation is achievable.

Figure 15:
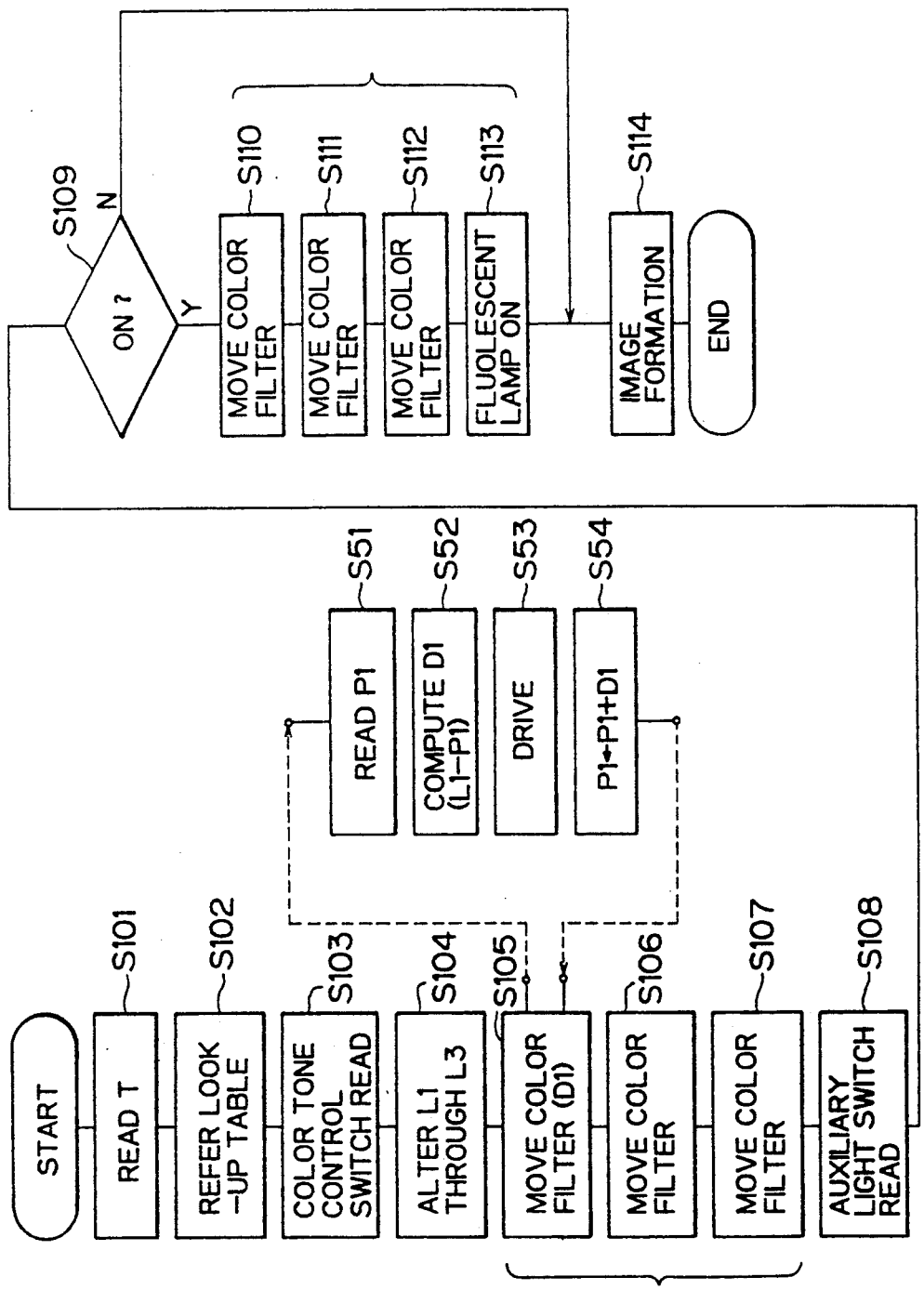
FIG. 15 is a flowchart for description of control routine executed by way of the control arrangement shown in FIG. 14.

The flowchart shown in FIG. 15 shows a control after the copy start key on the operation panel 109A is rendered ON. The CPU 171 monitors the manipulations to various switches on the operation panel 109A through the PIO 173. If the copy start key is depressed the program is started, and the output value from the A/D converter 177 is read by the CPU 171 through the PIO 173, and the read value is stored in the RAM 173 in Step 101. The value outputted from the A/D converter 177 is a digitallized value T from an analog temperature value outputted from the temperature sensor 111. The temperature is substantially the same as the temperature of the microcapsule sheet 12 on the exposure stand 11.

Next, in Step 102, the look-up table 172a stored in the ROM 172 is checked up on a basis of the temperature data T read in Step S101. Therefore, optimum insertion amounts of the respective filters are read out. The CPU 171 in connection with the Step S102 can be referred to as "optimum, exposure condition controlling means" which determines at least one of the optimum filter position and optimum light irradiation amount from, the light source 5a. Therefore, the insertion amounts L1, L2, and L3 of the yellow, magenta and cyan filters 61, 62 and 63 of the filter unit 6 are provided, and insertion amounts L4, L5 and L6 of the yellow, magenta and cyan filters 91a, 91b, 91c of the auxiliary exposure unit 80 are also provided.

Then, in Step S103, manipulated state of the color tone control switch on the operation panel 109A is read by the CPU 171 through the PIO 173. With the manipulation to the color tone control switch, desirable color correction can be set. In Step 104, with reference to the desired color tone correction, the insertion amounts L1, L2, and L3 are corrected. In the described embodiment, the color tone control switch provides five stage corrections from minus 2 level to plus 2 level with respect to each color of yellow, magenta and cyan. For example, if the yellow color intensity is intended to be increased by plus one level, the yellow filter insertion amount L1 is increased by "1". Further, if the red color intensity is intended to be increased by plus two level, insertion amounts L1 and L2 of the yellow and magenta filters are respectively increased by "1". The color tone control switch on the operation panel 109A can be referred to as "manual color tone control input means", and the CPU 171 in connection with the Steps S104 can be referred to as "modifying means for modifying the optimum filter position in accordance with the input data of the desired color tone".

Next is Step S105, the CPU 171 controls movements of the color filters on the basis of the corrected insertion amounts in Step S105. Incidentally, for simplicity, reference is made on the insertion of the yellow filter only. First, in Step S151, a variable P1 indicative of the present yellow filter 61 position is read from the RAM 173, and in Step 152, a value D1 (D1=L1−P1) is computed. It should be noted that the variable P1 is reset to "0" at the time of electrical power supply. However, after one cycle of the copying operation has been carried out, the variable P1 is modified in a subsequent Step S154. Therefore, in Step S153, the CPU 171 controls the rotation of the stepper motor 65 so that the stepper motor 65 can be angularly rotated by stepping numbers corresponding to the value D1. Here, if the D1 is a positive value, the stepper motor 65 is rotated to insert the filter 61 toward the optical path, and if the D1 is a negative value, the stepper motor 65 is rotated to retract the yellow filter 61 away from the optical path. Next, in the Step S154, D1 is added to the previous P1 value so as to obtain a new P1 value which is stored in the RAM 173. Similar sub-routines are executed with respect to the magenta and cyan filters 62, 63 in Steps 106 and 107.

Then, the routine goes to Step S108 in which a state of the auxiliary exposure switch on the operation panel 109A is read by the CPU 171, and in Step S109 judgment is made as to whether or not the auxiliary exposure switch is rendered ON. If the judgment falls Yes, the routine proceeds into Steps S110, S111 and S112 so that auxiliary yellow, magenta and cyan color filters 91a, 91b, 91c of the auxiliary exposure unit 80 are moved in a manner similar to the step S105 (S151 through S154). Then in Step S113, the auxiliary light source 87 is turned ON for performing auxiliary exposure operation for the purpose of color gradation control. Thereafter, the routine goes into Step S114 for the above described image recording operation. On the other hand, in the Step S109, if the auxiliary exposure switch on the operation board 109A is rendered OFF, the routine jumps into the Step 114.

In the Step 114, the reflection mirror 8, the halogen lamp 5a, and the first pair of reflection mirrors 9a and 9b are controlledly moved at the controlled velocity by the CPU 171 in accordance with the copying magnification rate "m". (As described above in item (1), the mirrors 9a and 9b are moved at a moving velocity of V/2m, while the halogen lamp 5a and the mirror 8 are moved at the moving velocity of V/m. Then, the CPU 171 supplies electrical current I to the halogen lamp 5a for the main exposure. Thus, one output copy image is formed on the developer sheet 28 discharged onto the discharge tray 33, to thereby end operation program for the single copy.

In the above described embodiment, various modifications may be conceivable. For exmaple, in the above described embodiment, different color filters are provided so as to control light color tone. However, instead of the filters, a plurality of light sources each having colored lights different from one another are provided, and light irradiation amounts of each of the light sources are independently controlled so as to provide various colored light.

Further, another kind of the auxiliary exposure unit can be provided. For example, a white reflection plate extending in a transverse direction of the exposure stand 11 is provided movable together with the halogen lamp of the auxiliary exposure unit. With the arrangement, the microcapsule sheet 12 is exposed to mixing light which is a mixture of the light emitted from the main light source 5a and reflected at the original and the light from the auxiliary light source and reflected from the white reflection plate. The light reflected from the white reflection plate serves as the auxiliary exposure. The white reflection plate is partly covered with color filters or a colored reflection plate so as to change the light spectrum of the auxiliary exposure light. However, since the auxiliary exposure light also passes through the filters 61 through 63 of the main filter unit 6, data to be stored in the look-up table must be modified.

Furthermore, in the above described embodiment, five control stages are provided for intended color tone control. However, the tone control can also be provided by a percentile basis by way of ten keys. For example, if the color intensity of the yellow component is intended to be increased by 50%, the ten keys are manipulated to depress 150%. In this case, the CPU 171 controls the insertion amount L1 of the yellow filter to increase by 1.5 times.

Incidentally inventive concept in the first and second embodiments may also be available for an apparatus for copying a slide film and printers using a CRT and a laser.

Thus, according to the second embodiment of the present invention, output images having stabilized quality are obtainable irrespective of temperature change. In other words, the image recording apparatus can be used under wide range temperature variations, and rapid copying operation is achievable taking the characteristic of the microcapsule sheet into consideration. This is achieved by changing the exposure condition in response to the temperature in order to change the spectral characteristic of the light irradiated onto the microcapsule sheet, to thereby correct change in coloring characteristic of the microcapsule sheet due to the temperature change. The exposure condition is at least one of a first exposure condition defined by the main exposure unit and a second exposure condition defined by the auxiliary exposure unit. Therefore, color gradation control as well as sensitivity control with respect to each coloring components can be achieved.

Further, according to the second embodiment, a desirable color tone intended by an operator can be easily obtained. That is, the manual color tone control input means is provided in the control arrangement, and the control arrangement includes the optimum exposure condition controlling means for determining optimum exposure condition in response to the temperature detected by the temperature sensor, and modifying means for modifying the determined optimum exposure condition in accordance with the data inputted from the manual color tone control input means. Accordingly, even if the temperature of the microcapsule sheet is changed during the exposure operation, (the temperature may be an ambient temperature around the microcapsule sheet positioned on the exposure stand), intended color tone control can be easily performed.

(7) Control Arrangement According to a Third Embodiment

A control arrangement according to a third embodiment of this invention will next be described with reference to FIGS. 16 through 22. In the third embodiment, attention is drawn to temperature increase or variation at the pressure developing unit. If the image recording operation is carried out for a prolonged period, internal temperature within the apparatus may be elevated due to heat generation from the pressure developing unit ect. Thus, output image may provide a degraded quality.

First, the relationship between coloring density of the microcapsule sheet 12 and the temperature at or around the pressure developing unit 22 will be described. The coloring density of the microcapsule sheet 12 is increased if the temperature is increased. Further, the change in coloring density of yellow, magenta and cyan relative to the temperature change is also different from one another. For example, if the temperature at or around the pressure developing unit is increased, the color density of yellow and cyan is greatly increased. Therefore, if high temperature is provided, insertion amounts of yellow filter 61 and the cyan filter 63 are decreased so as to provide a proper color balance. Further, in order to lower the increased coloring density of entire colors, light irradiation amount of the halogen lamp 5a is increased.

Further, if the temperature is elevated, entire gradation will become dull, and change in gradation level with respect to each color of yellow, magenta and cyan are also different from one another due to the temperature change. For example, due to the temperature elevation, the gradation of the yellow and cyan will be enhanced, whereas gradation of the magenta is not so enhanced. Therefore, in case of the high temperature at or around the pressure developing unit 22, insertion amounts of the yellow filter 91a and the cyan filter 91c of the auxiliary exposure unit 80 are increased so as to provide the uniform gradation. Further, irradiation amount of the auxiliary light source 87 is decreased so as to entirely lower the gradation of each colors.

Figure 16:
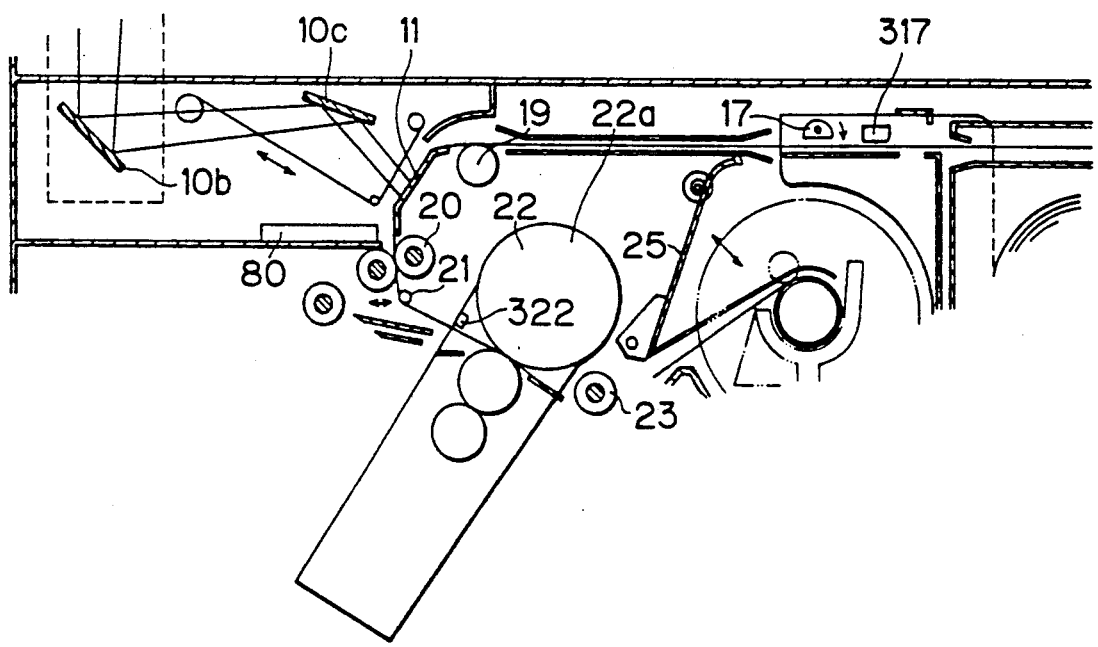
FIGS. 16 and 21 are a partial schematic cross-sectional view particularly showing an image recording apparatus provided with a temperature sensor and a bar code sensor according to a third embodiment of this invention.

With the above in mind, according to the third embodiment of this invention, a temperature sensor 322 is provided at the pressure developing unit 22 as shown in FIG. 16 for detecting a temperature at our around the pressure developing unit 22. Further, the leader tape portion provided at the tip end portion of the rolled microcapsule sheet is printed with a bar code (not shown). The bar code is indicative of the sensitivity of the microcapsule sheet 12. In order to read the bar code, a bar code sensor 317 is provided at a position between the sector roller 17 and the sheet cartridge 15. The bar code sensor 317 is attached to the magazine 16. At the microcapsule sheet automatic loading operation, the bar code sensor 317 reads the bar code, so that the sensitivity of the microcapsule sheet 12 is automatically inputted into a CPU 103A of the control arrangement shown in FIG. 17.

Figure 17:
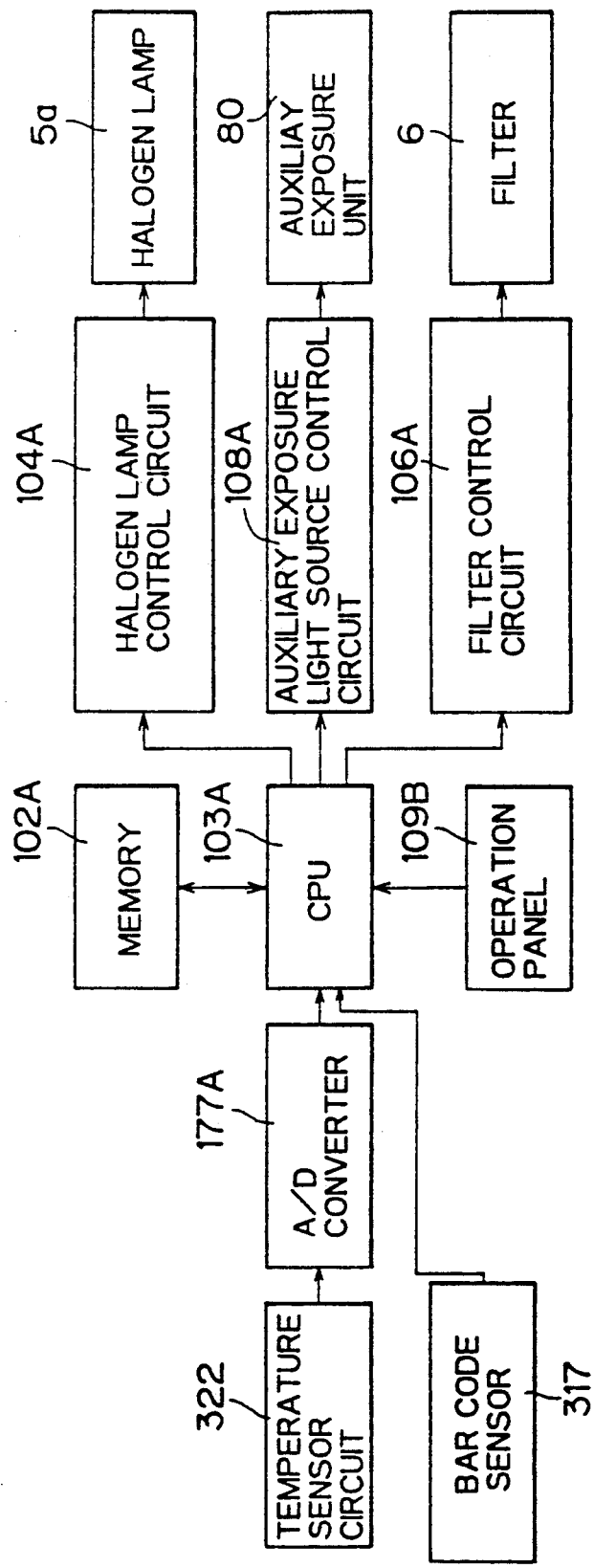
FIG. 17 is a block diagram showing a control arrangement for controlling filter insertion amounts and exposure amounts in response to a temperature at or around a pressure developing unit according to the third embodiment of this invention.

The control arrangement shown in FIG. 17 is approximately similar to that of the first and second embodiments except that a CPU 103A is connected to the bar code sensor 317 and the temperature sensor 322. A memory means 102 stores therein data of filter insertion amounts of the main and auxiliary exposure units and exposure amounts thereof in response to the temperature at or around the pressure developing unit 22 and in response to the sensitivity of the microcapsule sheet 12. The function of an A/D converter 177A, an operation panel 109B, a halogen lamp control circuit 104A, an auxiliary exposure unit control circuit 108A and a filter control circuit 106A are the same as those of the foregoing embodiments, and therefore, further description is negligible.

Figure 18:
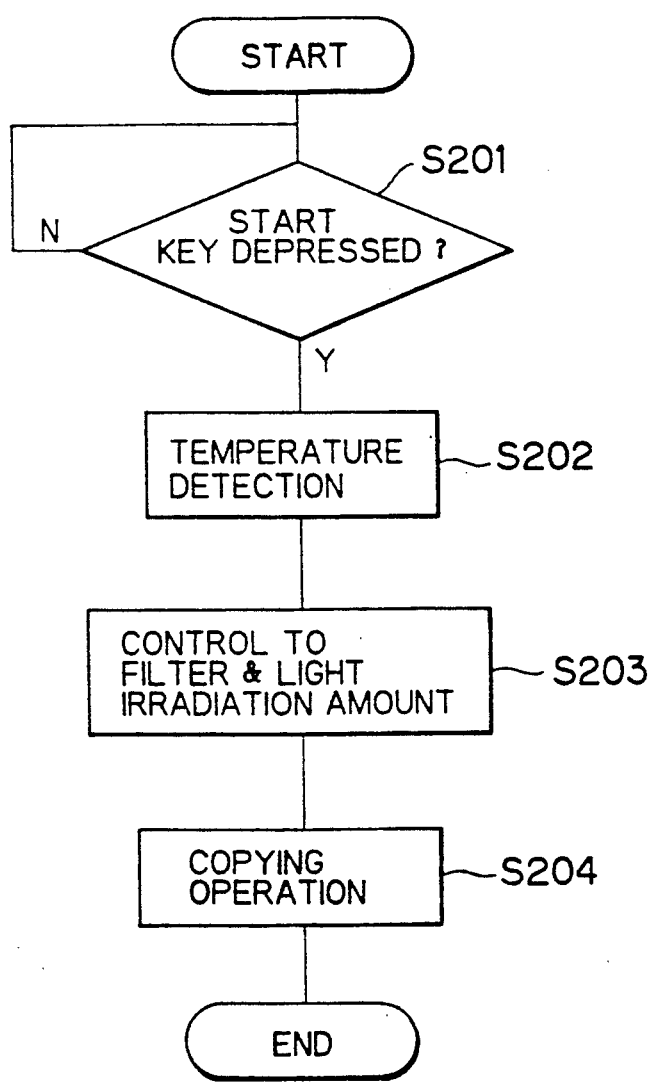
FIG. 18 is a flowchart for description of control routine executed by way of the control arrangement shown in FIG. 17.

A control routine according to the third embodiment is shown in FIG. 18. In Step S201, judgment is made as to whether or not the start key is depressed. If the judgment falls Yes, the routine goes to Step S202 where temperature at or around the pressure developing unit 22 is detected, and the detected temperature is inputted into the CPU 103A. Then, in Step S203, insertion amounts of the respective filters 61 through 63 and 91a through 91c and exposure amounts of the main halogen lamp 5a and the auxiliary light source 87 in accordance with the detected temperature are read out from the memory means 102A, and light irradiation amounts of the light sources and the filter insertion amounts are controlledly provided in accordance with the read data.

More specifically, if high temperature at or around the pressure developing unit 22 is detected, the CPU 103A sends output signal to the halogen lamp control circuit 104A, the filter control circuit 106A and the auxiliary exposure unit control circuit 108A, through the table memory 102A, so that insertion amount of the yellow filter 61 and the cyan filter 63 are decreased, and light irradiation amount of the halogen lamp 5a is increased, to thereby correct or restrain the increase in coloring density. Further, insertion amounts of the yellow filter 91a and the cyan filter 91c of the auxiliary exposure unit 80 are increased and the light irradiation amount from the auxiliary light source 87 is decreased so as to correct or restrain increase in color gradation.

Then, the routine proceeds into Step S204 for starting the ordinary copying operation. In this case, since the sensitivity of the microcapsule sheet 12 is automatically inputted into the CPU 103A from the bar code sensor 317, the positions of respective filters of the filter unit 6 is corrected in response to the sensitivity. After the copying operation, the program is ended.

One modification can be made in the third embodiment. In the modification, attention is drawn to gamma characteristic and temperatures at the pressure developing unit 12 and the exposure stand 11. The relationship is shown in a graph depicted in FIG. 19. In this graph, the line implies variation range in production lot. As is apparent from the graph, if the temperature of the pressure developing 22 unit is high temperature and the temperature of the exposure stand 11 are room temperature, dim image (high gradation) is provided. If the temperatures of the pressure developing unit 22 and the exposure stand 11 are both high temperatures gradation is lowered. Similarly, if the temperature of the pressure developing unit 22 has a room temperature and the temperature of the exposure stand 11 has high temperature, the gradation is also lowered. Further, if the temperatures of both the pressure developing unit 22 and the exposure stand 11 have room temperatures, clear image (low gradation) is obtainable.

Figure 20:
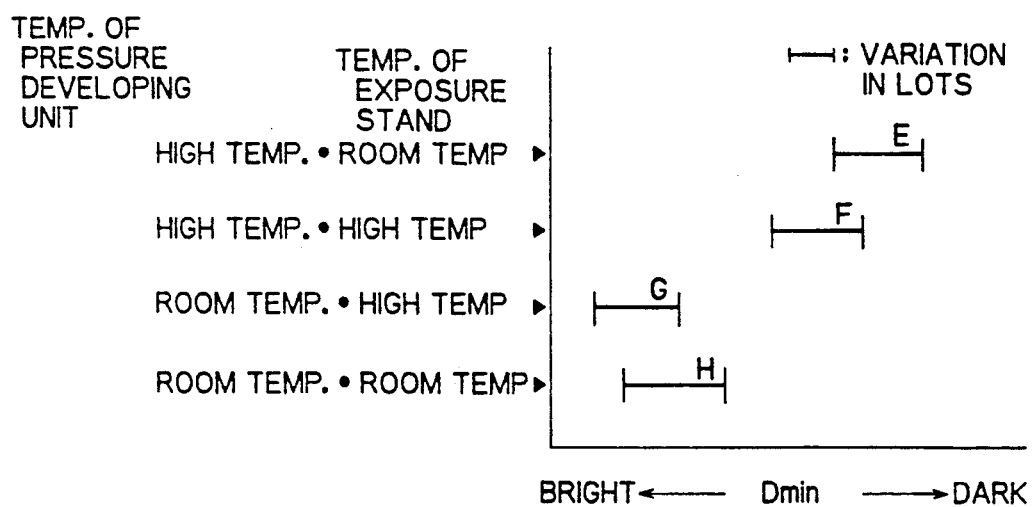
FIG. 20 is a graph showing the relationship between Dm and temperatures of the pressure developing unit and the exposure stand; particularly showing an image recording apparatus provided with a temperature sensor for detecting a temperature of the exposure stand and a heater for heating the exposure stand in addition to the temperature sensor and the bar code sensor of FIG. 16 according to one modification to the third embodiment of this invention.

Further, in the modification, attention is also drawn to the relationship between Dmim (density minimum) which is indicative of reproducibility of white color and temperatures of the pressure developing unit 22 and the exposure stand 11. This relationship is shown in FIG. 20. As is apparent from the graph shown in FIG. 20, bright image is obtainable if the temperature of the pressure developing unit has room temperature and the temperature of the exposure stand 11 has room or high temperature. Further, dark image is obtained if the temperature of the pressure developing unit 22 has high temperature and temperature of the exposure stand has room or high temperature.

Figure 21:
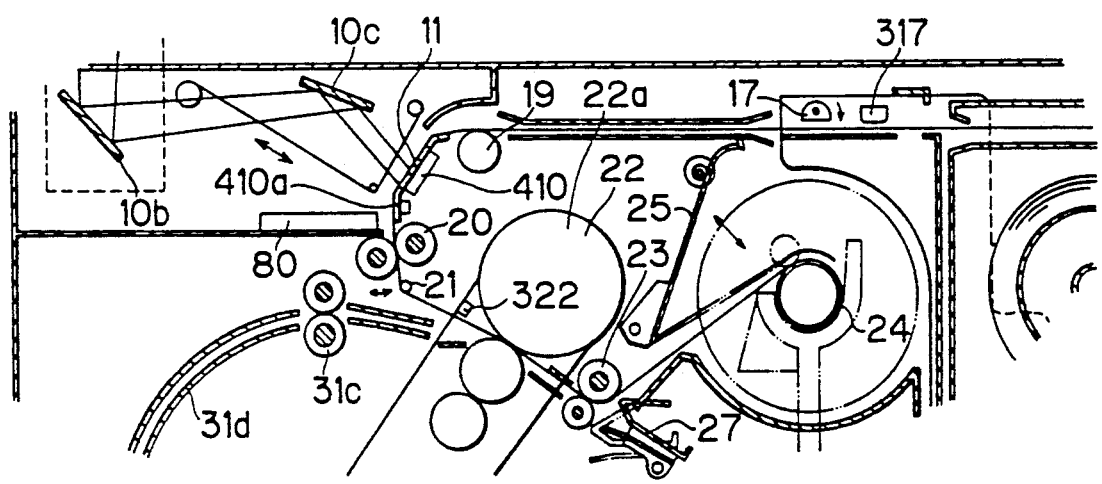

With the above in view, according to the modified embodiment, the operation panel 109B (FIG. 17) is further provided with a copy mode change switch, one mode being a document mode in which clear image (low gradation) is generally required, and another mode is a picture mode in high gradation is generally required. To achieve this, as shown in FIG. 21, a heater 410 and a temperature sensor 410a are further provided in addition to the temperature sensor 322 and the bar code sensor 317. The temperature sensor 410a is adapted to detect the temperature at the exposure stand 11, and the heater 410 is adapted to heat the exposure stand 11. The electrical power supply to the heater 410 is controlled by the CPU, 103A in response to the temperature sent from the temperature sensor 410a to the CPU 103A. Remaining structure would be the same as that of the third embodient shown in FIGS. 16 and 17.

Figure 22:
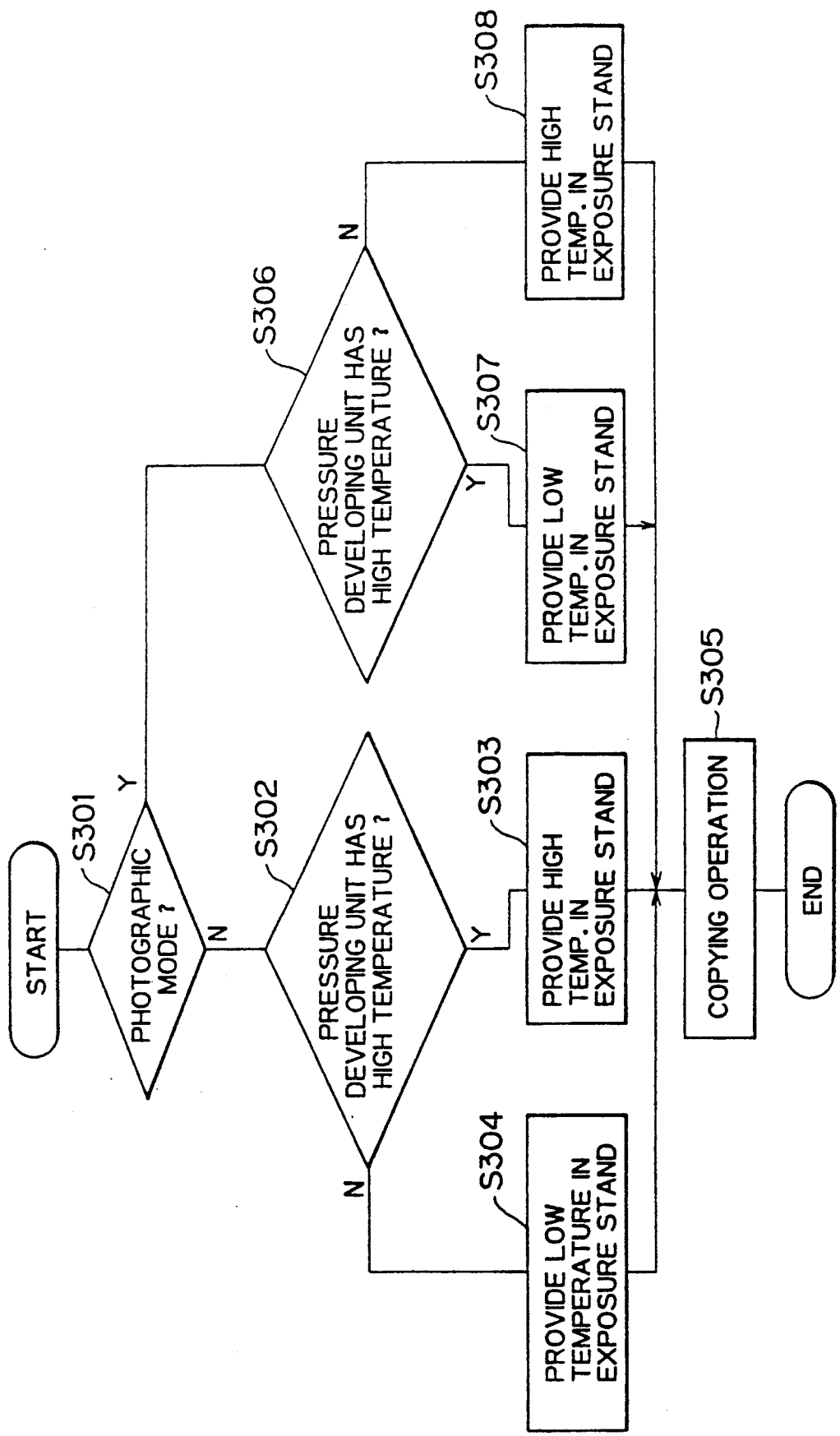
FIG. 22 is a flowchart for description of control routine executed by way of the modified embodiment shown in FIG. 21.
Figure 23:
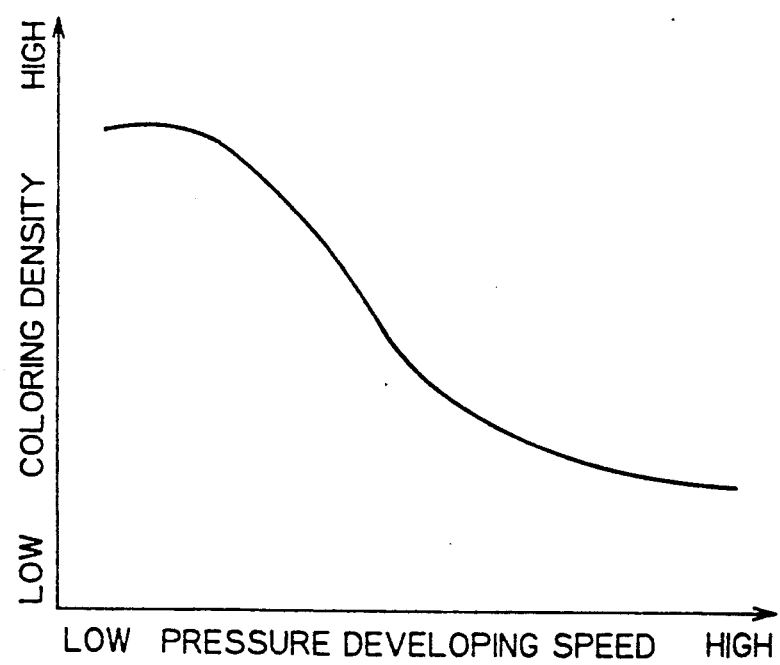
FIG. 23 is a graphical representation showing the relationship between pressure developing speed and coloring density.

Control routine in the modified embodiment is shown by a flowchart shown in FIG. 22. If a copy start key is depressed, determination is made in CPU 103A as to whether or not the picture mode is selected in Step S301. If the determination falls No (i.e., the document mode is selected), the routine goes to Step S302 where determination is made as to whether or not the pressure developing unit 22 has high temperature. This determination is made by a detection sent from the temperature sensor 322 to the CPU 103A. If the determination falls Yes, the exposure stand 11 is heated by the heater 410 in Step S303 in order to obtain low gradation (clear image) in accordance with the line B in FIG. 19. In this heating step, the temperature sensor 410a sends a temperature data to the CPU 103A for feed-back control to the heater 410.

Figure 19:
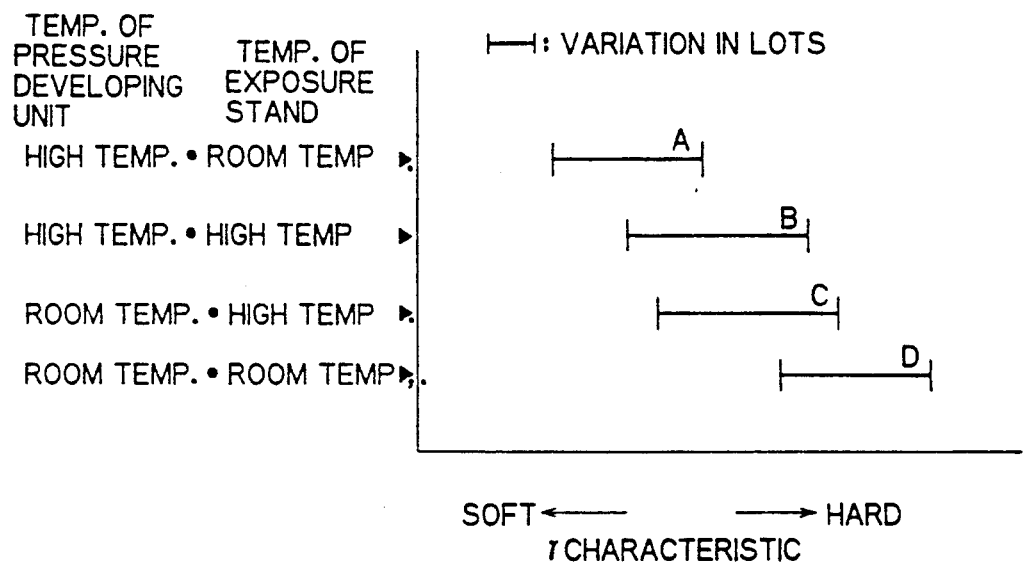
FIG. 19 is a graphical representation showing the relationship between gamma characteristic and temperatures of the pressure developing unit and the exposure stand.

On the other hand, in Step S302, if the judgment falls No (i.e., the temperature of the pressure developing unit has low temperature), no electrical current is applied to the heater 410 in Step S304 in accordance with the line D of FIG. 19 in order to obtain the clear image. Then, copying operation is carried out in Step S305. Thus, gamma characteristic of the microcapsule sheet 12 becomes low gradation, so that high contrast clear image is obtainable. In this case, Dmin data would be the lines F or H. Therefore, if the temperature of the pressure developing unit 22 has high temperature, Dmin characteristic would be lowed (line F). However, in the latter case, this can be improved by increasing light irradiation amount from the halogen lamp 5a.

In Step S301, if the picture mode is selected, the routine proceeds into Step S306 where judgment is made as to whether or not the temperature of the pressure developing unit 22 has high temperature by way of the temperature sensor 322. If the high temperature is detected, the judgment falls Yes, and the routing goes into Step S307 where no electrical current is applied to the heater 410 in acordance with the line A of FIG. 19 in order to obtain high gradation image. On the other hand, in Step S306, if the temperature of the pressure developing unit 22 has low temperature, the routine proceeds into Step S3-8 where the exposure stand 11 is heated by the heater 410 in accordance with the line C in FIG. 19 to obtain high gradation image. This heating control is carried out by the feed back operation by way of the temperature sensor 410a and the CPU 103A. With this state, the copying operation is carried out in Step S305. Thus gamma characteristic of the microcapsule sheet becomes soft to provides high gradation image.

According to the modified embodiment, the internal temperature within the image recording apparatus is increased due to heat generation from various components for a long period of operation, and the temperature at or around the pressure developing unit 22 may also be changed. However, in accordance with the temperature change, the temperature control is performed with respect to the exposure stand 11 in addition to the control to the exposure condition. Therefore, stabilized quality is obtainable in the output images regardless of the temperature change at or around the pressure developing unit.

In the present embodiment, further modifications may be made similar to the foregoing embodiments. For example, key board is provided on the operation panel 109B so as to manually input the date of filter positions and irradiation amount of the halogen lamps in order to obtain a desirable color tone. Further, instead of the control to the filter positions for the purpose of the color tone control, independent light sources can be provided for the corresponding filters, and light irradiation amount of each of the light sources is controlled independent of one another for the same purpose. Moreover, the inventive concept can be applied to the printers and other kinds of image recording apparatus.

(8) Control Arrangement According to Fourth Embodiment

Control arrangement according to a fourth embodiment of this invention will next be described with reference to FIGS. 23 through 26. Exposure speed is sometimes obliged to be changed so as to compensate the variation in exposure amount, the exposure amount control being required in case of the employment of the color filters for the purpose of controlling the color balance of the output image and in case of the magnification and reduction in output image size. However, in the image recording apparatus, exposure operation and the pressure developing operation are concurrently achieved in order to reduce a sheet path length. Therefore, the feeding speed in the exposure operation is the same as the pressure developing speed. Thus, if the exposure speed is changed, the pressure developing speed must also be changed.

If the pressure developing speed is changed, impulse per a unit area with respect to the microcapsule sheet is changed even if the applied pressure is maintained at a constant level. Accordingly, transferring amount of the color forming material may be changed, to thereby vary change in coloring density. More specifically, as depicted in a graph shown in FIG. 23, if the pressure developing speed becomes high, the coloring density becomes lowered. If the image size is changed such as enlargement copying or reduction copying, exposure amount is controlled by changing exposure speed. If the exposure speed is changed, the pressure developing speed is also changed, to thereby change the coloring density. For example, in case of the enlargement copying, exposure speed is lowered, and accordingly, the pressure developing speed is also lowered.

Figure 24:
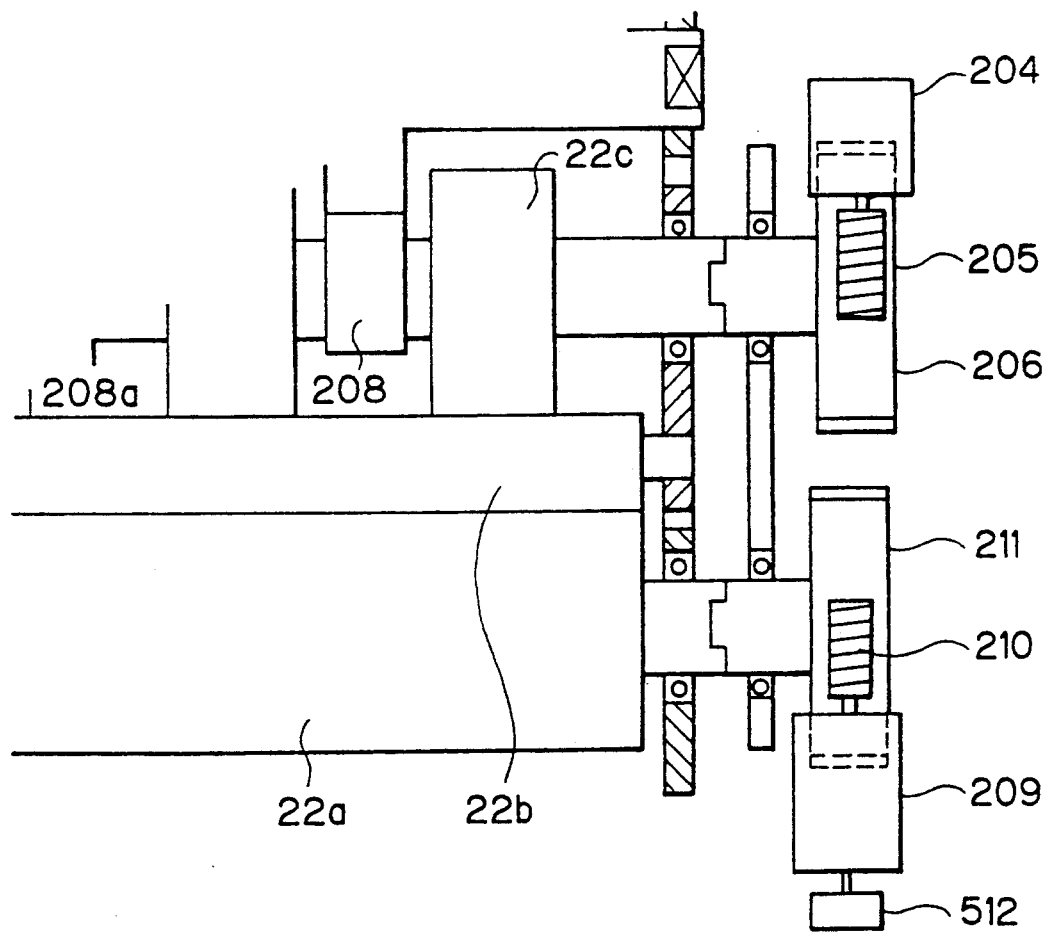
FIG. 24 is a schematic view showing the pressure developing unit provided with a rotation speed sensor according to a fourth embodiment of this invention.
Figure 25:
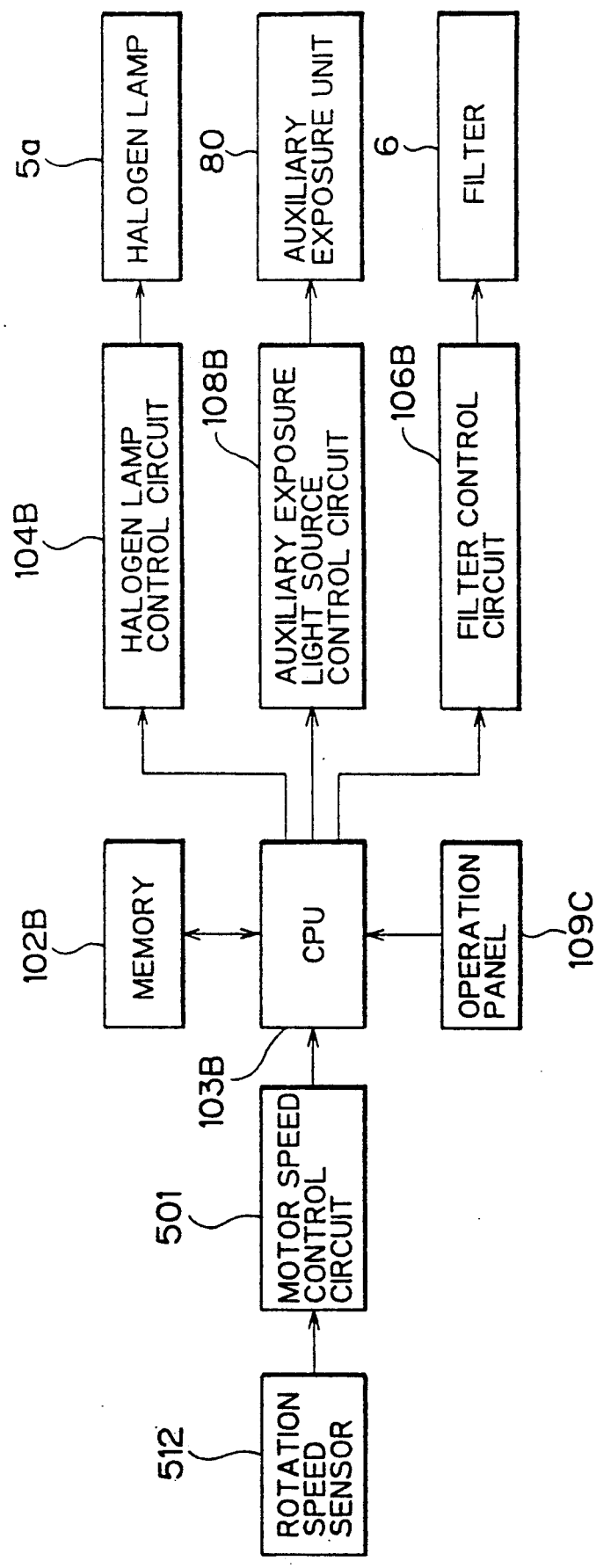
FIG. 25 is a block diagram showing a control arrangement for controlling filter insertion amounts and exposure amounts in response to the pressure developing speed according to the fifth embodiment of this invention.

With the above in mind, according to the fourth embodiment of this invention, as shown in FIG. 24 a rotation speed sensor 212 is connected to the pressure roller drive motor 209 so as to detect rotation speed of the drive motor 209, and the rotation speed sensor 212 is connected to the control arrangement shown in FIG. 25.

According to the control arrangement shown in FIG. 25, a CPU 103B is connected to a motor speed control circuit 501 which is connected to the rotation speed sensor 512. Further, an operation panel 109c is connected to the CPU 103B similar to the foregoing embodiments. The panel includes a copy start key, copying magnification control key and a color tone control key as described above. A memory means 102B is also connected to the CPU 103B. The memory means 102B stores therein data of light irradiation amount of the halogen lamp 5a and insertion amounts of each of the filters 61, 62, 63 of the filter unit 6 in accordance with the pressure developing speed. Further, similar to the foregoing embodiments, halogen lamp control circuit 104B, filter control circuit 106B, and auxiliary exposure unit control circuit 108B are connected to the CPU 103B. These circuits are respectively connected to the halogen lamp 5a, the filter unit 6 and the auxiliary exposure unit 80. The auxiliary exposure unit control circuit 108B controls light irradiation amount of the auxiliary light source 87, for example.

Figure 26:
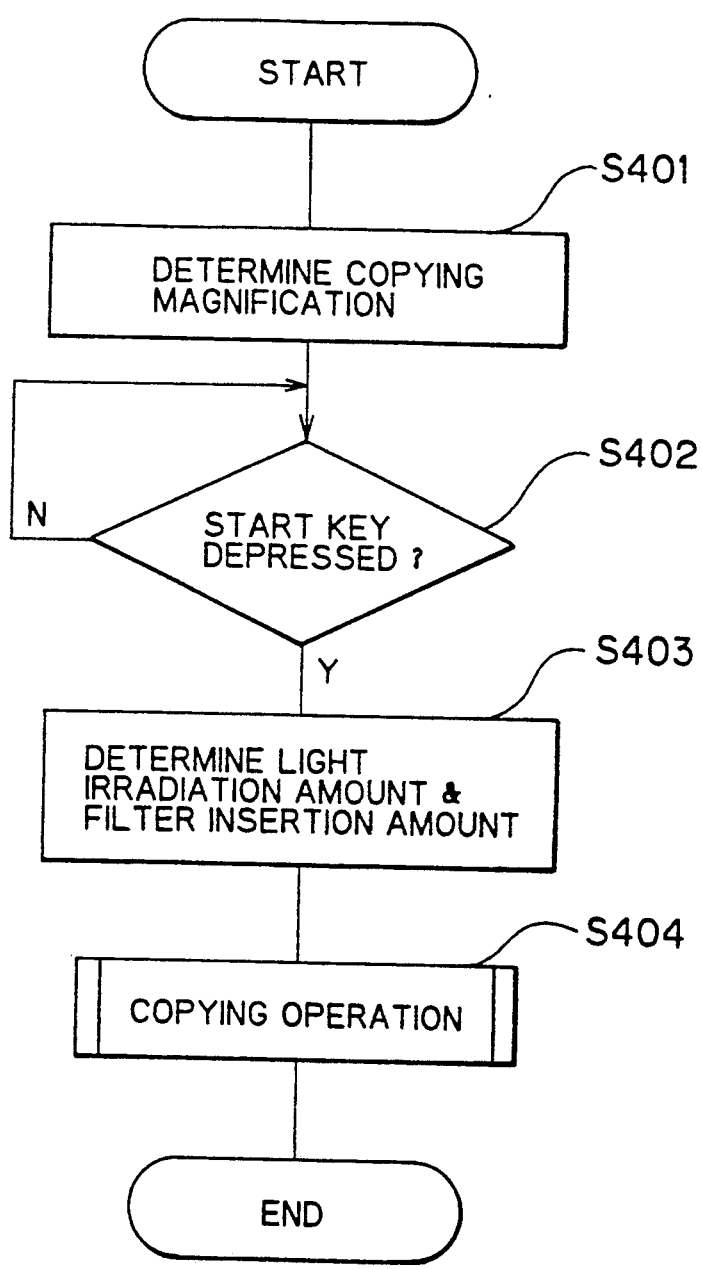
FIG. 26 is a flowchart for description of control routine executed by way of the control arrangement shown in FIG. 25.

Next, control routing according to the fourth embodiment will be described with reference to a flowchart shown in FIG. 26.

After the copy start key on the operation panel 109C is depressed, light irradiation amount of the halogen lamp 5a, positions of the filters 61 through 63, and auxiliary exposure unit 80 are controlled. That is, in Step S401, the copying magnification is determined by the manipulation to the magnification control key on the operation panel 109C, and in Step S302, judgment is made as to whether or not the copy start key is depressed. If the determination falls Yes, the routine goes to Step S403 where optimum light irradiation amount of the halogen lamp 5a and the auxiliary light source 87 and the filter positions of the filter unit 6 in accordance with the pressure developing speed are read from the memory means 102B.

More specifically, in case of the enlargement copying, the pressure developing speed is lowered since the exposure speed is lowered. Accordingly, the coloring density becomes increased. To avoid this, light irradiation amount from the halogen lamp 5a is increased to suppress the increase in the coloring density. If the light irradiation amount of the main exposure light source 5a is increased, the light color balance may be changed. That is, blue color light component is increased in comparison with the green color component, and red color component is decreased. Therefore, insertion amount of the yellow filter 61 is increased while the insertion amount of the cyan filter 63 is decreased for the spectrum control.

In case of the reduction copying, reverse control is required. That is, in this case, the light irradiation amount from the halogen lamp 5a is decreased, so that blue component is reduced in comparison with the green component, whereas red component is increased. Therefore, insertion amount fo the yellow filter 61 is decreased, while the insertion amount of the cyan filter is increased.

If the pressure developing speed is lowered, gradation is also lowered. Therefore, in this case, the light irradiation amount from the auxiliary light source 87 is increased to improve gradation characteristic. The memory means 102B stores therein the above described date as to the filter insertion amount, and light irradiation amount those corresponding to the pressure developing speed, i.e., rotation speed of the presure roller 209 detected by the rotation speed sensor 512.

Then, the above described copying operation is performed in Step S404, and the program is ended.

The fourth embodiment is provided with the color tone control arrangement for obtaining intended or desirable color tone. The arrangement is the same as that described in connection with the second embodiment (FIG. 15), and therefore, further description can be neglected.

According to the fourth embodiment of this invention, since the halogen lamps 5a and 87 and filter unit 6 are controlled by the CPU 103B in accordance with the data stored in the memory means 102B, the data corresponding to the pressure developing speed. Further, insertion amount of the auxiliary filters 91a through 91c is also controlled in a manner similar to the foregoing embodiment, if necessary, so as to further control the gradation in response to the pressure developing speed. Therefore, stabilized output image having stabilized coloring density is obtainable regardless of the pressure developing speed. Even if the exposure control is carried out by not changing the exposure speed but changing the exposure amount, the fourth embodiment having the rotation speed sensor is still effective, since the sensor can detect the minute change in rotation speed of the pressure roller 209, and the data of the speed change is inputted to the CPU 103B for controlling the exposure condition and for controlling the drive motor 209 through the motor speed control circuit 501.

(9) Control Arrangement According to Fifth Embodiment

A control arrangement according to a fifth embodiment of this invention will next be described with reference to Figs, 27 through 30. The fifth embodiment also pertains to the pressure developing unit similar to the third and fourth embodiments. The pressure developing unit 22 provides a predetermined nipping force between the large diameter pressure roller 22a and the small diameter pressure roller 22b by regulating biasing force of the compression springs 232 in manufacturing the image recording apparatus. However, the biasing forces of the springs 232 are gradually reduced due to long period of use. Accordingly, nipping force is also gradually reduced. Further, the cam shaft 208a and the support shaft 230 may be deformed due to the prolonged use of the apparatus. Therefore, the above described nipping force may also be decreased. In order to recover the predetermined nipping force, each of the springs 232 undergoes independent adjustment, which work is troublesome for an operator.

Figure 27:
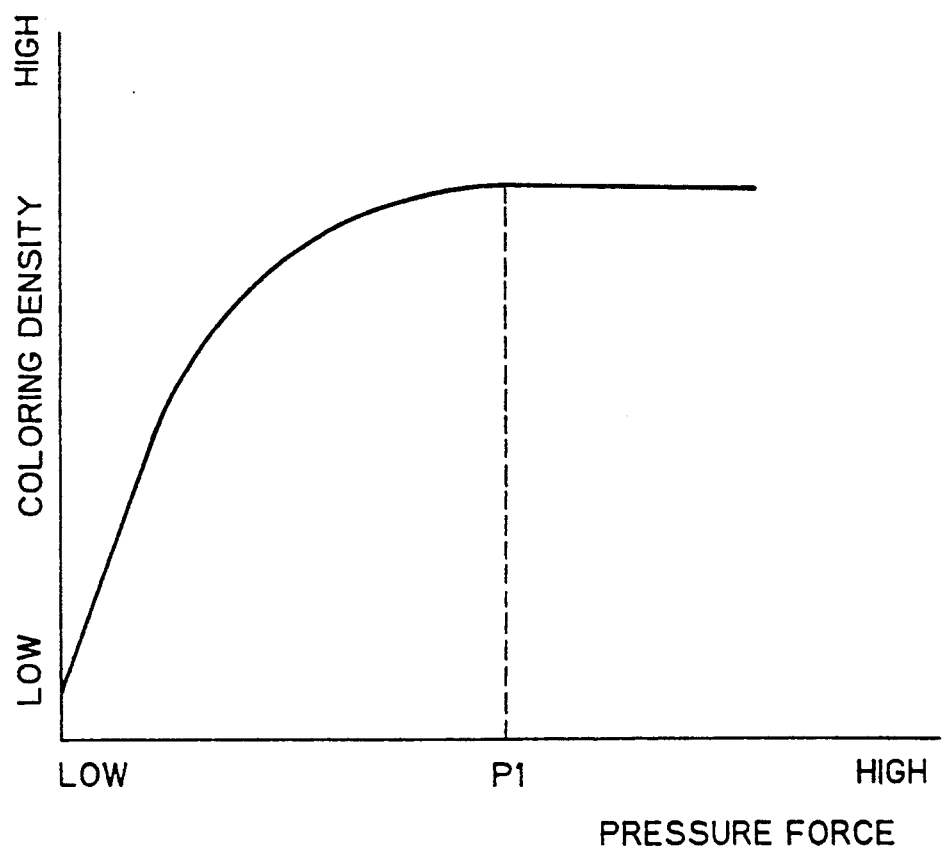
FIG. 27 is a graphical representation showing the relationship between the coloring density of the microcapsule sheet and nipping pressure of pressure rollers of the pressure developing unit.

FIG. 27 shows a graph which shows the relationship between the nipping force provided by the pair of pressure rollers 22a and 22b and coloring density of the microcapsule sheet 12. As is apparent from the graph, if the pressure or nipping force is reduced, the coloring density is also reduced. That is, if the nipping force is reduced, unexposed microcapsules may not be easily ruptured, and therefore, reaction of the chromogenic material with the developer material may not easily occur, to thereby lower the coloring density.

Figure 28:
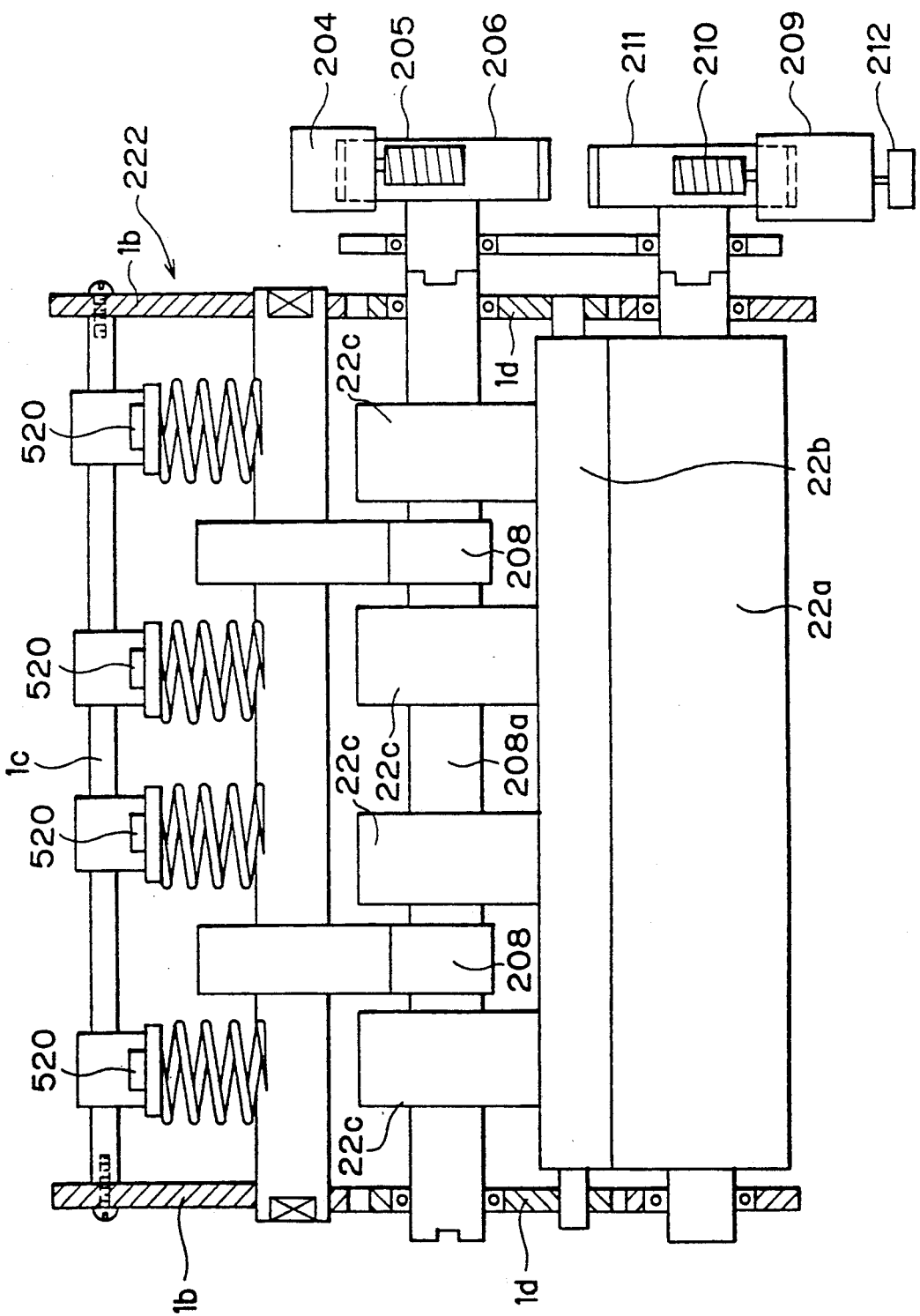
FIG. 28 is a schematic view showing the pressure developing unit provided with pressure sensors according to a fifth embodiment of this invention.
Figure 29:
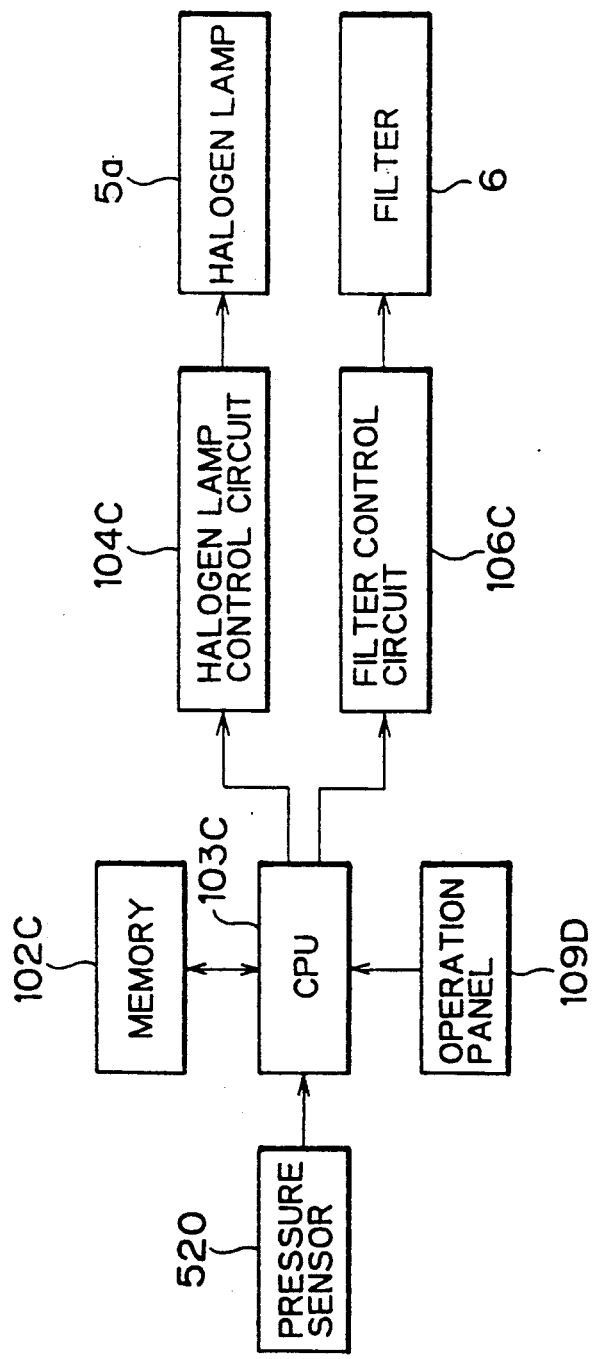
FIG. 29 is a block diagram showing a control arrangement according to the fifth embodiment.

With the above in mind, according to the fifth embodiment of this invention, as shown in FIG. 28, pressure sensors 520 are further provided to the corresponding springs 232 for detecting the nipping force defined between the large and small diameter pressure rollers 22a and 22b. The pressure sensors 520 are connected to the control arrangement shown in FIG. 29.

According to the control arrangement, similar to the foregoing embodiments, connected to CPU 103C are memory means 102C, an operation panel 109D, a halogen lamp control circuit 104C, and filter control circuit 106C. The pressure sensors 520 are also connected to the CPU 103C. The memory means 102C stores therein date of optimum light irradiation amount of the halogen lamp 5a and optimum insertion amounts of the filters 61, 62, 63 of the filter unit 6 in accordance with the variation in nipping pressure. The memory content is summarized as follows:

If the pressure sensors 520 detect a nipping pressure smaller than a reference pressure P2, the light irradiation amount of the halogen lamp 5a is lowered to obtain increased coloring density. By the increase in the irradiation amount, color balance is changed, so that the blue component becomes weaker than the green component and red component becomes intensive. In this case, the insertion amount of the yellow filter 61 is decreased while insertion amount of the cyan filter 63 is increased. Such control data are provided at every change in pressure levels, so that optimum exposure condition can be provided in response to the pressure change.

Figure 30:
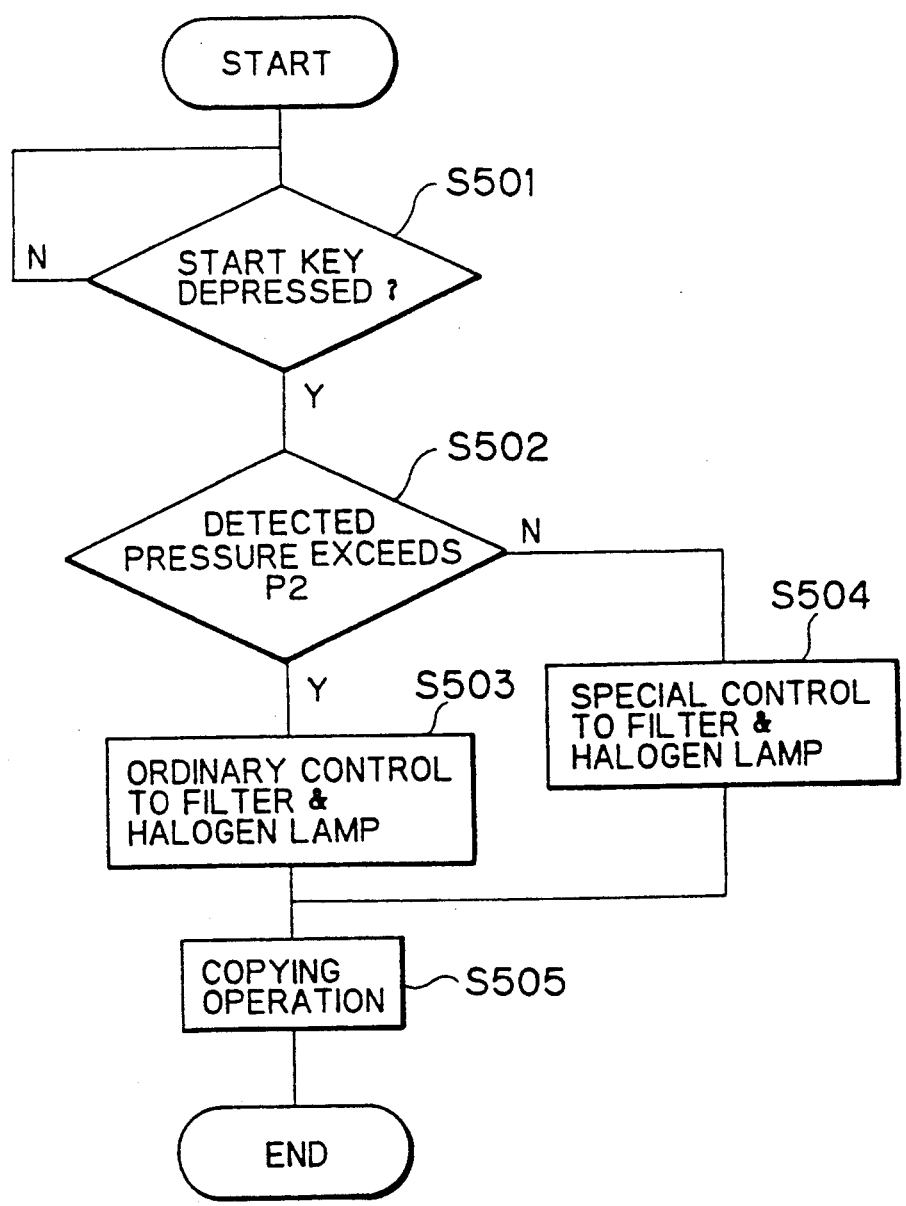
FIG. 30 is a flowchart for description of control routine executed by way of the control arrangement of the fifth embodiment.

With the arrangement, when the copy start key is depressed, the halogen lamp 5a and the filter unit 6 are controlled by fetching the data stored in the memory means 102C, the data corresponding to the detected nipping pressure detected by the pressure sensor 520. More specifically, referring to a flowchart shown in FIG. 30, in Step S501, determination is made as to whether or not the copy start key is depressed. If the determination falls Yes, the routine proceeds into Step S502 where pressure data is transmitted from the pressure sensor 520 to the CPU 102C and judgment is made as to whether nor not the nipping pressure is higher than the predetermined reference pressure P2. If the determination falls Yes, in Step S503, predetermined light irradiation amount of the halogen lamp 5a and predetermined positions of the filters 61 through 63 are read from the memory means 102 so as to control the halogen lamp 5a and the filters 61, 62, 63 based on the read data.

On the other hand, if the detected pressure is lower than the predetermined reference pressure P2, the routine goes from the Step S502 to Step S504. In the Step S504, optimum irradiation amount of the light source 5a and the optimum filter positions of the filters 61, 62, 63 in accordance with the detected pressure are read out from the memory means 102C. That is, the light irradiation amount of the halogen lamp 5a is decreased by way of the halogen lamp control circuit 104C, and insertion amount of the yellow filter 61 is decreased while insertion amount of the cyan filter 83 is increased by way of the filter control circuit 106C.

Then, the routine proceeds into Step S505 where the above described copying operation is performed, and then, the program is ended.

In the fifth embodiment, the above described auxiliary exposure unit 80 is also employable. That is in the Step S504, light irradiation amount of the auxiliary light source 87 can be controlled and/or the positions of the auxiliary filters are also controlled so as to control color gradation. The details of these arrangement and control arrangement therefor is the same as those described in the foregoing embodiments.

Incidentally, several modifications may be made in this embodiment. For example, a color tone control can be made by manipulation to the operation panel 109D. Further, the position of the filters and the irradiation amount of the light source can be controlled by the manipulation to a key board on the operation panel 109D. Further, the inventive concept is also available for the slide film copying machine and printers using CRT or laser.

Thus, in the fifth embodiment, even if the nipping force or pressure at the pressure rollers is changed or reduced due to the prolonged employment of the image recording apparatus, the pressure change does not affect the coloring density of the microcapsule sheet because of the control arrangement which controls exposure condition in accordance with the pressure change.

(10) Control Arrangement According to Sixth Embodiment

A control arrangement according to a sixth embodiment of this invention will be described with reference to FIG. 31 and FIG. 16. The sixth embodiment is similar to the third, fourth and fifth embodiment in association with the pressure developing unit 22. In the third embodiment, attention is drawn to the temperature change at or around the pressure developing unit 22, in the fourth embodiment attention is drawn to the pressure developing speed, and in the fifth embodiment attention is drawn to the nipping pressure of the pressure rollers 22a and 22b of the pressure developing unit 22. In these embodiments, exposure conditions are controlled in response to the change in the temperature, pressure developing speed, and pressure applied to the microcapsule sheet 12 with respect to the pressure developing unit. In the sixth embodiment, these factors are considered in a composite fashion in terms of Dmim characteristic of the microcapsule sheet 12.

Figure 31:
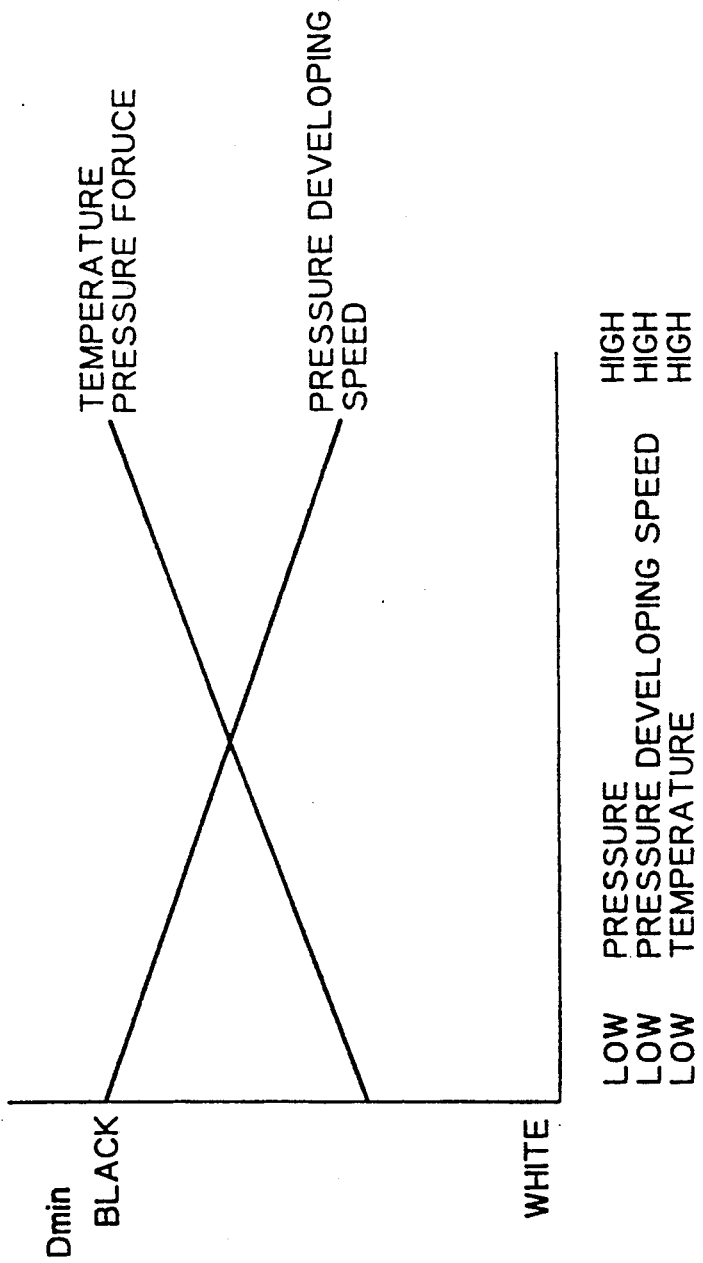
FIG. 31 is a graphical representation showing the relationship between Dmin and temperature at the pressure developing unit, pressure developing speed and pressure level in the pressure developing unit.

That is, as depicted in a graph shown in FIG. 31, the Dmin characteristic which is indicative of white color reproducibility is enhanced if the pressure developing speed is increased. Further, the Dmin is lowered if the temperature of the pressure developing unit is increased, and if the nipping pressure is increased.

With the above in view, if the temperature at the pressure developing unit 22 is elevated due to, for example, ambient temperature increase so that the white color reproducibility is lowered, the temperature of the pressure developing unit 22 is detected by the temperature sensor 322 (FIG. 16) and pressure developing speed and/or the nipping pressure is controlled in response to the detected temperature. Therefore, white color reproducibility can be enhanced. For this corresponding memory means is provided for storing therein data of pressure developing speed and nipping pressure in accordance with temperature change.

(11) Control Arrangement According to Seventh Embodiment

A control arrangment according to a seventh embodiment of this invention will be described with reference to FIGS. 32 and 33. In the seventh embodiment, attention is drawn to the temperature within the thermal fixing unit 32. Color gradation on the developer medium 28 is changeable dependent on the temperature within the thermal fixing unit 32. If the thermal fixing operation is carried out without any consideration to the thermal fixing temperature, stabilized output image may not be obtainable. Therefore, in this embodiment, exposure condition is controllable by the control arrangement in accordance with change in the thermal fixing temperature.

Figure 32:
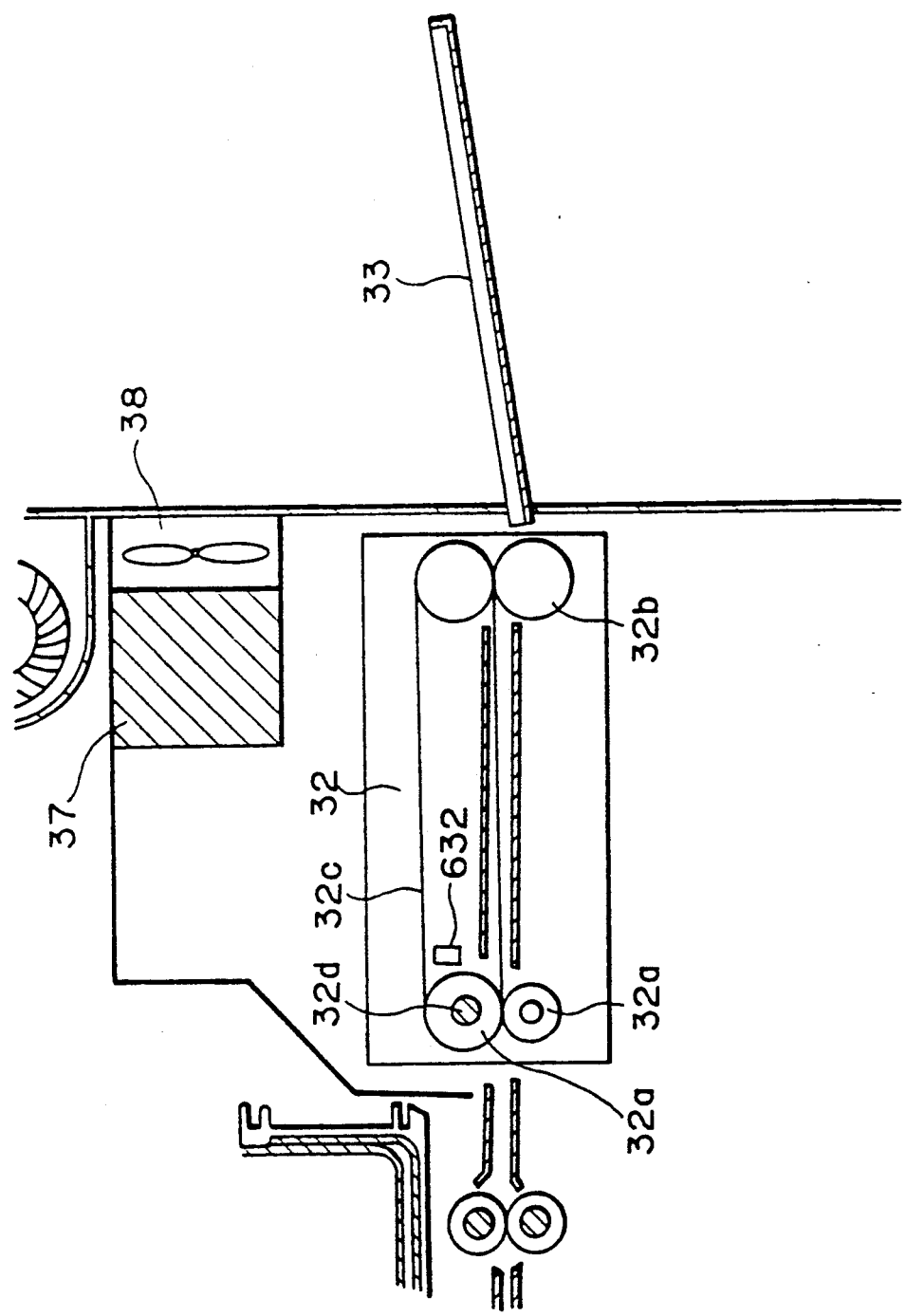
FIG. 32 is a partial cross-sectional view showing a thermal fixing unit according to a seventh embodiment of this invention.
Figure 33:
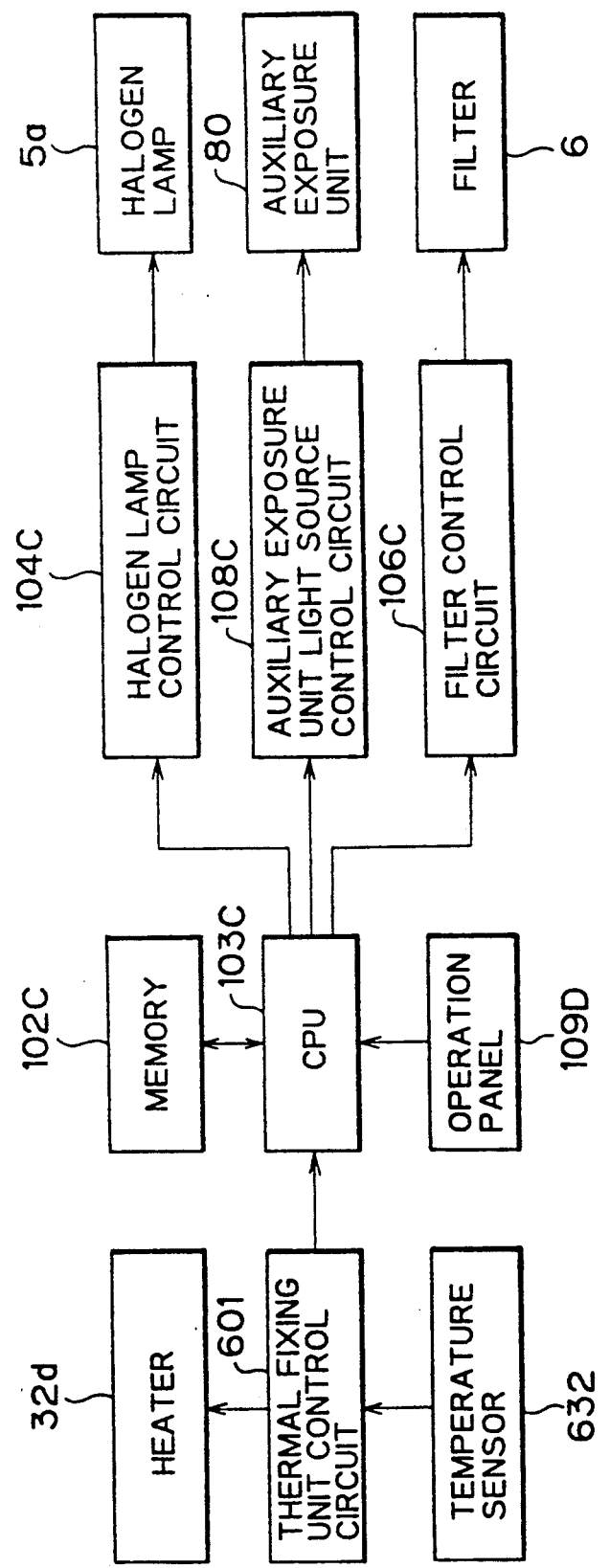
FIG. 33 is a block digram showing a control arrangement according to the seventh embodiment.

To this effect, as shown in FIG. 32, a temperature sensor 632 is provided within the thermal fixing unit 32 for detecting the temperature of this unit 32 for detecting a temperature at the thermal fixing operation, and the temperature sensor 632 is connected to the control arrangement shown in FIG. 33.

In the control arrangement, a thermal fixing unit control circuit 601 connected to the heater 32d is connected to CPU 103C, and the temperature sensor 632 is connected to the control circuit 601. Further, an operation panel 109D is connected to the CPU 103C. The operation panel 109D includes a copy start key, manual exposure amount control key, and a toggle type mode selection switch for selecting one of gloss mode and non-gloss mode of the output image. Furthermore, a memory means 102C is connected to the CPU 103C. The memory means stores 102C therein data of irradiation amount of the light sources 5a and 87 and insertion amount of the filters in accordance with the detected temperature. Moreover, a halogen lamp control circuit 104C, auxiliary exposure unit control circuit 108C and filter control circuit 106C are connected to the CPU 103C similar to the foregoing embodiments. The circuits are respectively connected to the halogen lamp 5a, the auxiliary exposure unit 80 and the filter unit 6 so as to conduct the above described control on a basis of the data stored in the memory means 102.

With the arrangement, if the copy start key is depressed, the halogen lamp 5a and the filter unit 6 are controlled by the halogen lamp control circuit 104 and the filter control circuit 106C in accordance with the selected one of the gloss mode and non-gloss mode, and in accordance with the temperature detected by the temperature sensor 632 on the basis of the data stored in the memory means 102C.

More specifically, the operator selects one of the gloss mode and non-gloss mode on the toggle type mode selection switch, and a signal indicative of the selected one of the mode is transmitted to the thermal fixing unit control circuit 601. Thus, the control circuit 601 controls electrical current to be flowed into the heater 32d. For example, the thermal fixing unit control circuit 601 provides a thermal fixing temperature of about 150° C. in case of the non-gloss mode and provides the temperature of about 170° C. in case of the gloss mode.

The thermal fixing temperature is detected by the temperature sensor 632, and the detected temperature is transmitted to the control circuit 601 for feed-back control to the heater 32d. In this case, preset temperature data is transmitted to the CPU 103C so as to fetch the optimum data stored in the memory means 102C. As a result, optimum light irradiation amount of the halogen lamp 5a and optimum filter position of the filter unit 6 can be determined as well as the optimum irradiation amount of the auxiliary light source 87, the optimum data being suitable for the preset temperature.

The thus determined data are transmitted to the halogen lamp through the halogen lamp control circuit 104C, filters 61, 62, 63 through the filter control circuit 108C, and to the auxiliary exposure unit 80 through the auxiliary exposure control circuit 108C. For example, if the thermal fixing temperature has high temperature, the developer sheet 28 provides high density output image. To avoid this, the CPU 103C sends a signal to the halogen lamp control circuit 104C so as to reduce the light irradiation amount of the halogen lamp 5a. Further, if the thermal fixing temperature is high, yellow color is emphasized in the output image. To avoid this, the CPU 103C controls sends a signal to the filter control circuit 106 so that the insertion amount of the yellow filter 61 can be decreased. In accordance with the increase in light irradiation amount of the halogen lamp 5a, the halogen lamp 5a has high temperature, which in turn changes spectrum characteristic. For example, blue component is increased in comparison with green component, and red component is decreased in comparison with the green component. Therefore, insertion amount of the yellow filter is increased while insertion amount of the cyan filter is decreased. Apparently, opposite control should be made if the thermal fixing temperature is lowered to decrease the light irradiation amount.

Further, if color gradation is changed due to the thermal fixing temperature, the control to the auxiliary exposure unit should be conducted in a manner similar to the above described embodiments.

In the present embodiment, several modifications may be made. For example, desirable color tone data can be provisionally stored in the memory unit 102C, so that an intended color tone can be provided in the output image by further controlling the filter insertion amount and the light irradiation amount on a basis of the desired tone. Further, such tone control can be manually made by manipulating a control key provided on the operation panel 109D.

Furthermore, data of insertion amounts of each of the filters 61 through 63 and filters 91a through 91c of the auxiliary exposure unit 80 and irradiation amounts of the halogen lamp 5a and the auxiliary light source 87 are provisionally stored in the memory means 102C, which data correspond to every minute grade of the temperatures in the thermal fixing unit 32. These filters and light sources are thus can be controlled in accordance with the exact temperature detected by the temperature sensor 632. Moreover, instead of the control of the filter positions, independent light sources can be provided for the respective filters, and color tone control can be made by controlling irradiation amount of each of the light sources, similar to the foregoing embodiments.

Thus, according to the seventh embodiment of this invention, stabilized output image can be obtained regardless of the change in thermal fixing temperature because of the control to the exposure condition.

While the invention has been described in detail and with reference to specific embodiments thereof, it would be apparent to those skilled in the art that various changes and modifications may be made therein without departing from the spirit and scope of the invention.

What is claimed is:

1. An image recording apparatus for forming a latent image corresponding to an image of an original on a photosensitive image recording medium and recording an output color image on a basis of the latent image on a developer medium; the photosensitive image recording medium being coated with different kinds of color forming materials, the apparatus comprising:

a frame;

an exposure unit for an exposure operation comprising a light source, a filter unit having a plurality of filters of different colors, and an exposure stand for forming the latent image on the photosensitive image recording medium positioned on the exposure stand, an optical path being provided between the light source and the exposure stand through the filter unit, and each of the filters being movable into and out of the optical path;

a pressure developing unit for applying pressure to the photosensitive recording medium carrying the latent image and the developer medium superposed therewith in order to provide the output image on the developer medium;

a thermal fixing unit positioned downstream of the pressure developing unit for thermally fixing the output image on the developer medium; and a sensor means for detecting one of humidity with the frame, temperature at or around the exposure unit, temperature at or around the pressure developing unit, temperature at the thermal fixing unit, a pressure developing speed of the pressure developing unit, and pressure level of the pressure developing unit;

control means connected to the filters for controlling position of the filters of the filter unit relative to the optical path in response to a detection by the sensor means.

2. The image recording apparatus as claimed in claim 1, wherein the control means comprises;

a central processing circuit to which the sensor means is connected;

a memory means connected to the CPU, data of position of the filters with respect to the optical path being stored in the memory means; and exposure unit control circuit connected between the CPU and the exposure unit for controlling the exposure unit in response to the detection from the sensor means.

3. The image recording apparatus as claimed in claim 2 wherein the sensor means comprises a humidity sensor for detecting a humidity around the exposure stand.

4. The image recording apparatus as claimed in claim 3, wherein the exposure unit comprises:

a first exposure unit including a first light source, a first filter unit having a first set of plurality of filters of different colors, and the exposure stand, and an auxiliary exposure unit positioned adjacent the exposure stand, and including an auxiliary light source, an auxiliary filter unit having an auxiliary set of plurality of filters of different, the optical path being defined between the first light source and the exposure stand.

5. The image recording apparatus as claimed in claim 4 wherein the exposure unit control circuit comprises;

a first light source control circuit connected between the CPU and the first light source;

a first filter unit control circuit connected between the CPU and the first filter unit, the memory means storing therein first data of insertion amount of the first set of filters with respect to the optical path and a second data of light irradiation amount of the first light source in accordance with the humidity detected by the humidity sensor, whereby sensitivities of color forming materials are correctable.

6. The image recording apparatus as claimed in claim 5, wherein the exposure unit control circuit further comprises an auxiliary exposure unit control circuit connected between the CPU and the auxiliary exposure unit, the memory means further storing third data of insertion amount of the auxiliary set of filters for moving at least one of the auxiliary set of filters into and out of the optical path in response to the humidity detected by the humidity sensor, whereby gradations of color forming materials are correctable.

7. The image recording apparatus as claimed in claim 6, wherein the auxiliary exposure unit control circuit is connected to the auxiliary light source and the auxiliary set of filters, and wherein the memory means further stores therein fourth data of light irradiation amount of the auxiliary light source for controlling the light irradiation amount of the auxiliary light source in response to the humidity detected by the humidity sensor, whereby gradations of the color forming materials is further correctable.

8. The image recording apparatus as claimed in claim 2, wherein the sensor means comprises a temperature sensor for detecting a temperature of the photosensitive image recording medium at the exposure operation.

9. The image recording apparatus as claimed in claim 8, wherein the exposure unit comprises:
   a first exposure unit including a first light source, a first filter unit having a first set of plurality of filters of different colors, and the exposure stand, and
   an auxiliary exposure unit positioned adjacent the exposure stand, and including an auxiliary light source, an auxiliary filter unit having an auxiliary set of plurality of filters of different, the optical path being defined between the first light source and the exposure stand.

10. The image recording apparatus as claimed in claim 9 wherein the exposure unit control circuit comprises;
   a first light source control circuit connected between the CPU and the first light source;
   a first filter unit control circuit connected between the CPU and the first filter unit, the memory means storing therein first data of insertion amount of the first set of filters with respect to the optical path and a second data of light irradiation amount of the first light source in accordance with the temperature detected by temperature sensor, whereby sensitivities of color forming materials are correctable.

11. The image recording apparatus as claimed in claim 10, wherein the exposure unit control circuit further comprises an auxiliary exposure unit control circuit connected between the CPU and the auxiliary exposure unit, the memory means further storing third data of insertion amount of the auxiliary set of filters for moving at least one of the auxiliary set of filters into and out of the optical path in response to the temperature detected by the temperature sensor, whereby gradations of color forming materials are correctable.

12. The image recording apparatus as claimed in claim 11, wherein the auxiliary exposure unit control circuit is connected to the auxiliary set of filters.

13. The image recoriding apparatus as claimed in claim 10, wherein the exposure unit control circuit further comprises an auxiliary exposure unit control circuit connected to the auxiliary light source, and wherein the memory means further stores therein another data of light irradiation amount of the auxiliary light source for controlling the light irradiation amount of the auxiliary light source in response to the temperature detected by the temperature sensor, whereby gradations of the color forming materials is further correctable.

14. The image recording apparatus as claimed in claim 1, wherein the sensor means comprises a temperature sensor for detecting a temperature of the photosensitive image recording medium at the exposure operation, and wherein the apparatus further comprising a manual color tone control input means connected to the control means, a manually input data from manual color tone control input means being transmitted to the control means.

15. The image recording apparatus as claimed in claim 14, wherein the control means comprises
   an optimum exposure condition controlling means for determining optimum exposure condition in response to the temperature detected by the temperature sensor; and
   modifying means for modifying the determined optimum exposure condition in accordance with the data inputted from the manual color tone control input means.

16. The image recording apparatus as claimed in claim 15, wherein the optimum exposure condition controlling means controls position of the filters of the filter unit.

17. The image recording apparatus as claimed in claim 9, wherein the control means is connected to the auxiliary exposure unit for controlling an exposure condition provided by the auxiliary exposure unit.

18. The image recording apparatus as claimed in claim 9, wherein the control means is connected to the first exposure unit and the auxiliary exposure unit for controlling a first exposure condition provided by the first exposure unit and a second exposure condition provided by the auxiliary exposure unit.

19. The image recording apparatus as claimed in claim 2 wherein the sensor means comprises a temperature sensor for detecting a temperature at or around the pressure developing unit.

20. The image recording apparatus as claimed in claim 19, wherein the exposure unit comprises:
   a first exposure unit including a first light source, a first filter unit having a first set of plurality of filters of different colors, and the exposure stand, and
   an auxiliary exposure unit positioned adjacent the exposure stand, and including an auxiliary light source, an auxiliary filter unit having an auxiliary set of plurality of filters of different, the optical path being defined between the first light source and the exposure stand.

21. The image recording apparatus as claimed in claim 20 wherein the exposure unit control circuit comprises:
   a first light source control circuit connected between the CPU and the first light source;
   a first filter unit control circuit connected between the CPU and the first filter unit, the memory means storing therein first data of insertion amount of the first set of filters with respect to the optical path and a second data of light irradiation amount of the first light source in accordance with the temperature detected by the temperature sensor, whereby sensitivities of color forming materials are correctable.

22. The image recording apparatus as claimed in claim 21, wherein the exposure unit control circuit further comprises an auxiliary exposure unit control circuit connected between the CPU and the auxiliary exposure unit, the memory means further storing third data of insertion amount of the auxiliary set of filters for moving at least one of the auxiliary set of filters into and out of the optical path in response to the temperature detected by the temperature sensor, whereby gradations of color forming materials are correctable.

23. The image recording apparatus as claimed in claim 22, wherein the auxiliary exposure unit control circuit is connected to the auxiliary light source and the auxiliary set of filters, and wherein the memory means further stores therein fourth data of light irradiation amount of the auxiliary light source for controlling the light irradiation amount of the auxiliary light source in response to the temperature detected by the temperature sensor, whereby gradations of the color forming materials is further correctable.

24. The image recording apparatus as claimed in claim 23, further comprising;
mode selection switch connected to the CPU for selecting a copying mode into one of a document mode and a picture mode;
a second temperature sensor connected to the CPU and positioned adjacent the exposure stand for detecting temperature of the exposure stand; and
a heater connected to the CPU and positioned adjacent the exposure stand for heating the exposure stand in response to the temperature at or around the pressure developing unit to thereby selectively provide high gradation and low gradation image in response to the selected one of the picture mode and the document mode.

25. The image recording apparatus as claimed in claim 2 wherein the sensor means comprises a speed sensor for detecting a pressure developing speed.

26. The image recording apparatus as claimed in claim 25, wherein the pressure developing unit comprises a pressure roller and a pressure roller drive motor connected to the pressure roller, the speed sensor being connected to the pressure roller drive motor to detect a rotation speed of the pressure roller drive motor.

27. The image recording apparatus as claimed in claim 26, wherein the exposure unit comprises:
a first exposure unit including a first light source, a first filter unit having a first set of plurality of filters of different colors, and the exposure stand, and
an auxiliary exposure unit positioned adjacent the exposure stand, and including an auxiliary light source, an auxiliary filter unit having an auxiliary set of plurality of filters of different, the optical path being defined between the first light source and the exposure stand.

28. The image recording apparatus as claimed in claim 27 wherein the exposure unit control circuit comprises;
a first light source control circuit connected between the CPU and the first light source;
a first filter unit control circuit connected between the CPU and the first filter unit, the memory means storing therein first data of insertion amount of the first set of filters with respect to the optical path and a second data of light irradiation amount of the first light source in accordance with the rotation speed detected by the speed sensor, whereby coloring density is correctable.

29. The image recording apparatus as claimed in claim 28, wherein the exposure unit control circuit further comprises an auxiliary exposure unit control circuit connected between the CPU and the auxiliary exposure unit, the memory means further storing therein third data of light irradiation amount of the auxiliary light source for controlling the light irradiation amount of the auxiliary light source in response to the rotation speed of the pressure roller detected by the speed sensor, whereby gradations of the color forming materials is further correctable.

30. The image recording apparatus as claimed in claim 28, further comprising a manual color tone control input means connected to the control means, the manually input data from the manual color ton control input means being transmitted to the control means.

31. The image recording apparatus as claimed in claim 2 wherein the sensor means comprises a pressure sensor for detecting a pressure of the pressure developing unit.

32. The image recording apparatus as claimed in claim 31, wherein the pressure developing unit comprises
a first pressure roller;
a record pressure roller movable toward and away from the first pressure roller the pressure being provided between the first and second pressure rollers for pressure developing the photosensitive recording medium and the developer medium; and
biasing means for biasing the second pressure roller toward the first pressure roller, the sensor means being provided to the biasing means for detecting the pressure.

33. The image recording apparatus as claimed in claim 32, wherein the exposure unit comprises:
a first exposure unit including a first light source, a first filter unit having a first set of plurality of filters of different colors, and the exposure stand, and
an auxiliary exposure unit positioned adjacent the exposure stand, and including an auxiliary light source, an auxiliary filter unit having an auxiliary set of plurality of filters of different, the optical path being defined between the first light source and the exposure stand.

34. The image recording apparatus as claimed in claim 33, wherein the exposure unit control circuit comprises;
a first light source control circuit connected between the CPU and the first light source;
a first filter unit control circuit connected between the CPU and the first filter unit, the memory means storing therein first data of insertion amount of the first set of filters with respect to the optical path and a second data of light irradiation amount of the first light source in accordance with the pressure detected by the pressure sensor, whereby coloring density of the photosensitive image recording medium are correctable.

35. The image recording apparatus as claimed in claim 34, wherein the exposure unit control circuit further comprises an auxiliary exposure unit control circuit connected between the CPU and the auxiliary exposure unit, the memory means further storing third data of insertion amount of the auxiliary set of filters for moving at least one of the auxiliary set of filters into and out of the optical path in response to the pressure detected by the pressure sensor, whereby color gradation is correctable.

36. The image recording apparatus as claimed in claim 35, wherein the auxiliary exposure unit control circuit is connected to the auxiliary light source and the auxiliary set of filters, and wherein the memory means further stores therein fourth data of light irradiation amount of the auxiliary light source for controlling the light irradiation amount of the auxiliary light source in response to the pressure detected by the pressure sensor, whereby color graduation is further correctable.

37. The image recording apparatus as claimed in claim 2 wherein the sensor means comprises a temperature sensor disposed within the thermal fixing unit for detecting a thermal fixing temperature.

38. The image recording apparatus as claimed in claim 27, wherein the thermal fixing unit comprises a heat roller for heating the developer medium, and a heater disposed within the heat roller, and the apparatus further comprises a heater control circuit connected to the CPU and to the temperature sensor.

39. The image recording apparatus as claimed in claim 38, wherein the exposure unit comprises:
a first exposure unit including a first light source, a first filter unit having a first set of plurality of filters of different colors, and the exposure stand, and
an auxiliary exposure unit positioned adjacent the exposure stand, and including an auxiliary light source, an auxiliary filter unit having an auxiliary set of plurality of filters of different, the optical path being defined between the first light source and the exposure stand.

40. The image recording apparatus as claimed in claim 39, wherein the exposure unit control circuit comprises;
a first light source control circuit connected between the CPU and the first light source;
a first filter unit control circuit connected between the CPU and the first filter unit, the memory means storing therein first data of insertion amount of the first set of filters with respect to the optical path and a second data of light irradiation amount of the first light source in accordance with the temperature detected by the temperature sensor, whereby coloring density on the developer medium is correctable.

41. The image recording apparatus as claimed in claim 40, wherein the exposure unit color circuit further comprises an auxiliary exposure unit control circuit connected between the CPU and the auxiliary exposure unit, the memory means further storing third data of insertion amount of the auxiliary set of filters for moving at least one of the auxiliary set of filters into and out of the optical path in response to the temperature detected by the temperature sensor.

42. The image recording apparatus as claimed in claim 41, wherein the auxiliary exposure unit control circuit is connected to the auxiliary light source and the auxiliary set of filters, and wherein the memory means further stores therein fourth data of light irradiation amount of the auxiliary light source for controlling the light irradiation amount of the auxiliary light source in response to the temperature detected by the temperature sensor.

43. An image recording apparatus for forming a color latent image corresponding to an image of an original on a photosensitive image recording medium and recording an output color image on a basis of the latent image on a developer medium; the photosensitive image recording medium being coated with different kinds of color forming materials, the apparatus comprising:
a frame;
an exposure unit comprising a first exposure unit and an auxiliary exposure unit, the first exposure unit including a first light source, a first filter unit having a first set of plurality of filters of different colors for forming the color latent image on the photosensitive image recording medium, and the auxiliary exposure unit being positioned adjacent the exposure stand and including an auxiliary light source, an auxiliary filter unit having an auxiliary set of plurality of filter of different colors for controlling a color gradation, an optical path being provided between the light source and the exposure stand through the first and auxiliary filter units, and each of the filters being movable into and out of the optical path;
a pressure developing unit positioned downstream of the exposure unit for applying pressure to the photosensitive recording medium carrying the latent image and the developer medium superposed therewith in order to provide the output image on the developer medium;
a thermal fixing unit positioned downstream of the pressure developing unit for thermally fixing the output image on the developer medium;
a sensor means for detecting one of humidity within the frame, temperature at or around the exposure stand, temperature at or around the pressure developing unit, temperature at the thermal fixing unit, a pressure developing speed of the pressure developing unit, and pressure level of the pressure developing unit;
control means connected to the sensor means and to the first set of filters, auxiliary set of filters, the first light source and the auxiliary light source for controlling at least one of a position of the first set of filters relative to the optical path, a position of the auxiliary set of filters relative to the optical path, irradiation amount of the first light source, and irradiation amount of the auxiliary light source in response to a detection from the sensor means the control means, the control means comprising a CPU and a memory means connected to the CPU, the memory means storing therein at least one of a first data of the first set of filters position, a second data of irradiation amount of the first light source, a third data of the auxiliary light source position, and a fourth data of irradiation amount of the auxiliary light source, these data being provided at every stages of one of the humidity, the temperature, the pressure developing speed and the pressure level.

44. An image recording apparatus for forming a color latent image corresponding to an image of an original on a photosensitive image recording medium and recording an output color image on a basis of the latent image on a developer medium, the apparatus comprising:
a pressure developing unit for applying pressure to the photosensitive recording medium carrying the latent image and the developer medium superposed therewith in order to provide the output image on the developer medium, the pressure developing unit providing a controllable pressure to the photosensitive recording medium and the developer medium;

a temperature sensor for detecting a temperature at or around the pressure developing unit; and control means connected to the temperature sensor and the pressure developing unit for controlling the pressure of the pressure developing medium in response to the temperature detected by the temperature sensor.

45. An image recording apparatus for forming a color latent image corresponding to an image of an original on a photosensitive image recording medium and recording an output color image on a basis of the latent image on a developer medium, the apparatus comprising:

a pressure developing unit for applying pressure to the photosensitive recording medium carrying the latent image and the developer medium superposed therewith in order to provide the output image on the developer medium, the pressure developing unit providing a controllable pressure developing speed;

a temperature sensor for detecting a temperature at or around the pressure developing unit; and control means connected to the temperature sensor and the pressure developing unit for controlling the pressure developing speed of the pressure developing medium in response to the temperature detected by the temperature sensor.

* * * * *